United States Patent
Taniguchi et al.

(10) Patent No.: US 7,499,147 B2
(45) Date of Patent: Mar. 3, 2009

(54) GENERATION METHOD OF LIGHT INTENSITY DISTRIBUTION, GENERATION APPARATUS OF LIGHT INTENSITY DISTRIBUTION, AND LIGHT MODULATION ELEMENT ASSEMBLY

(75) Inventors: Yukio Taniguchi, Yokohama (JP); Hiroyuki Ogawa, Nara (JP); Masayuki Jyumonji, Yokohama (JP); Noritaka Akita, Hiratsuka (JP); Masakiyo Matsumura, Kamakura (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 322 days.

(21) Appl. No.: 11/275,961

(22) Filed: Feb. 7, 2006

(65) Prior Publication Data

US 2006/0177973 A1    Aug. 10, 2006

(30) Foreign Application Priority Data

Feb. 8, 2005    (JP)    ............... 2005-031188

(51) Int. Cl.
G03B 27/72    (2006.01)
G03B 27/32    (2006.01)
(52) U.S. Cl. .......................... 355/69; 355/77
(58) Field of Classification Search .................. 355/53, 355/55, 67–71, 77; 250/548; 356/399–401
See application file for complete search history.

(56) References Cited

U.S. PATENT DOCUMENTS 7,173,688 B2 *    2/2007    Wiener et al. ................. 355/69
7,232,982 B2 *    6/2007    Takami .................... 250/208.1

FOREIGN PATENT DOCUMENTS

JP    2004-186449    7/2004
JP    2004-193229    7/2004

OTHER PUBLICATIONS

N. Akita, et al., "Visualization of Single-Shot Excimer-Laser Light-Pulse Profiles", IDW '04 Proceedings of the 11TH International Display Workshops, AMDp-33L, 2004, pp. 499-500, Cover Sheet and Table of Contents.

* cited by examiner

Primary Examiner—Hung Henry Nguyen
(74) Attorney, Agent, or Firm—Oblon, Spivak, McClelland, Maier & Neustadt, P.C.

(57)    ABSTRACT

A generation method of a light intensity distribution uses a first light modulation element and a second light modulation element which are arranged to be apart from each other by a distance D and face each other in parallel to optically modulate a light beam which enters the light modulation elements, thereby generating a light intensity distribution on a target surface. The first light modulation element has a pattern formed by repeating a basic unit having a pitch P. The distance D is set to a distance with which the light intensity distribution generated on the predetermined surface is not changed even if a relative position of the first light modulation element and the second light modulation element is shifted in a plane direction.

10 Claims, 14 Drawing Sheets

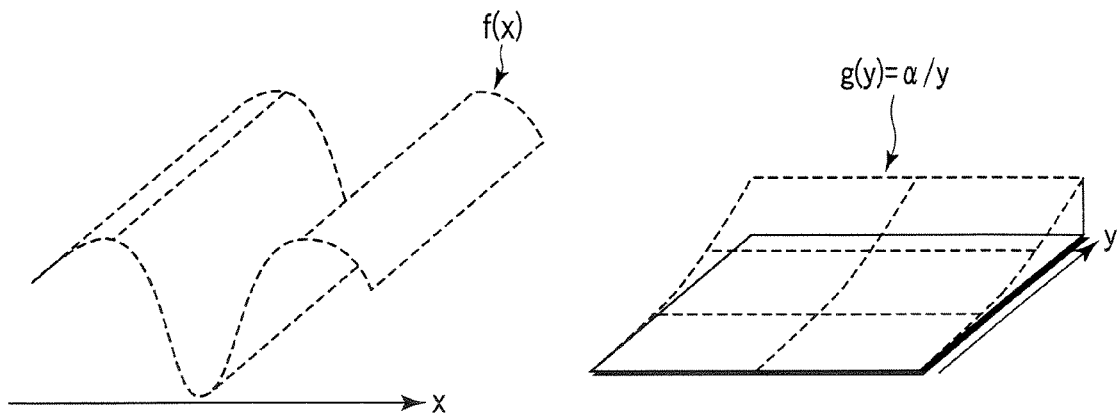
FIG. 6A
FIG. 6B
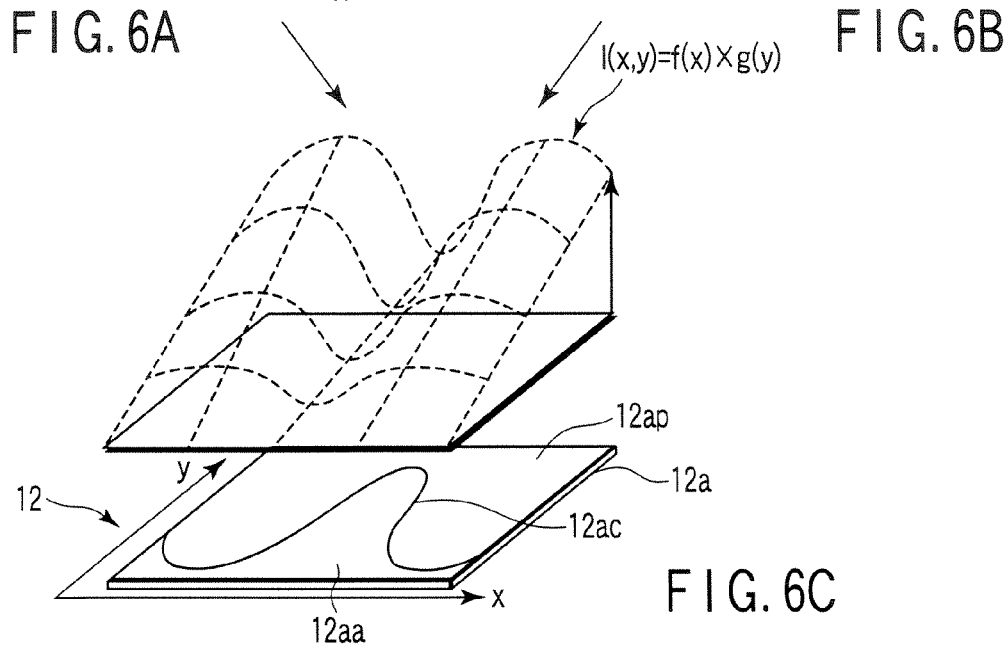
FIG. 6C
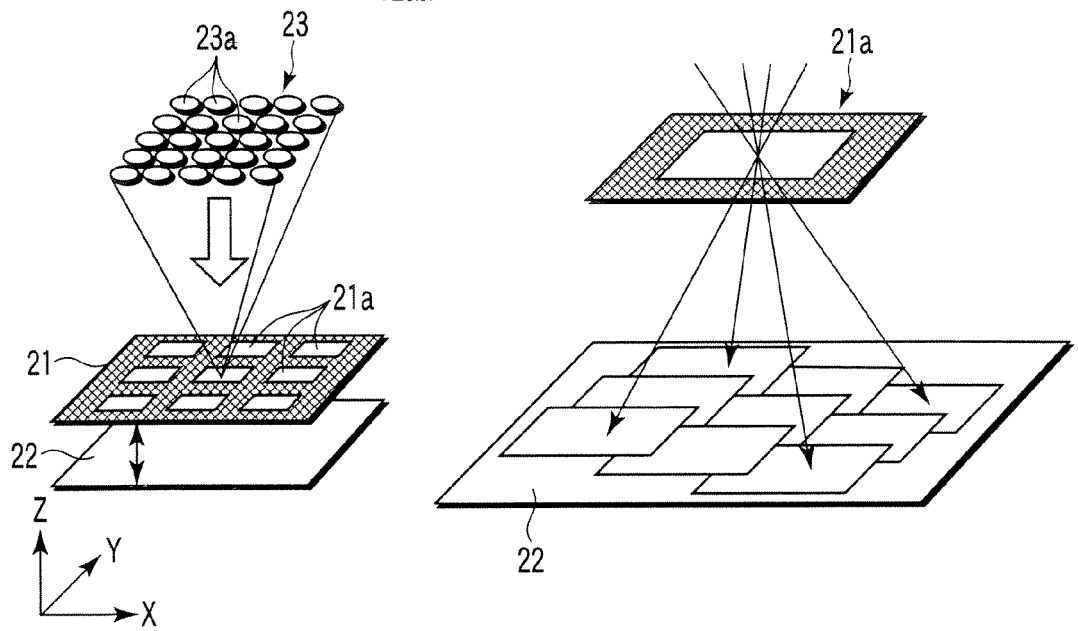
FIG. 7A
FIG. 7B

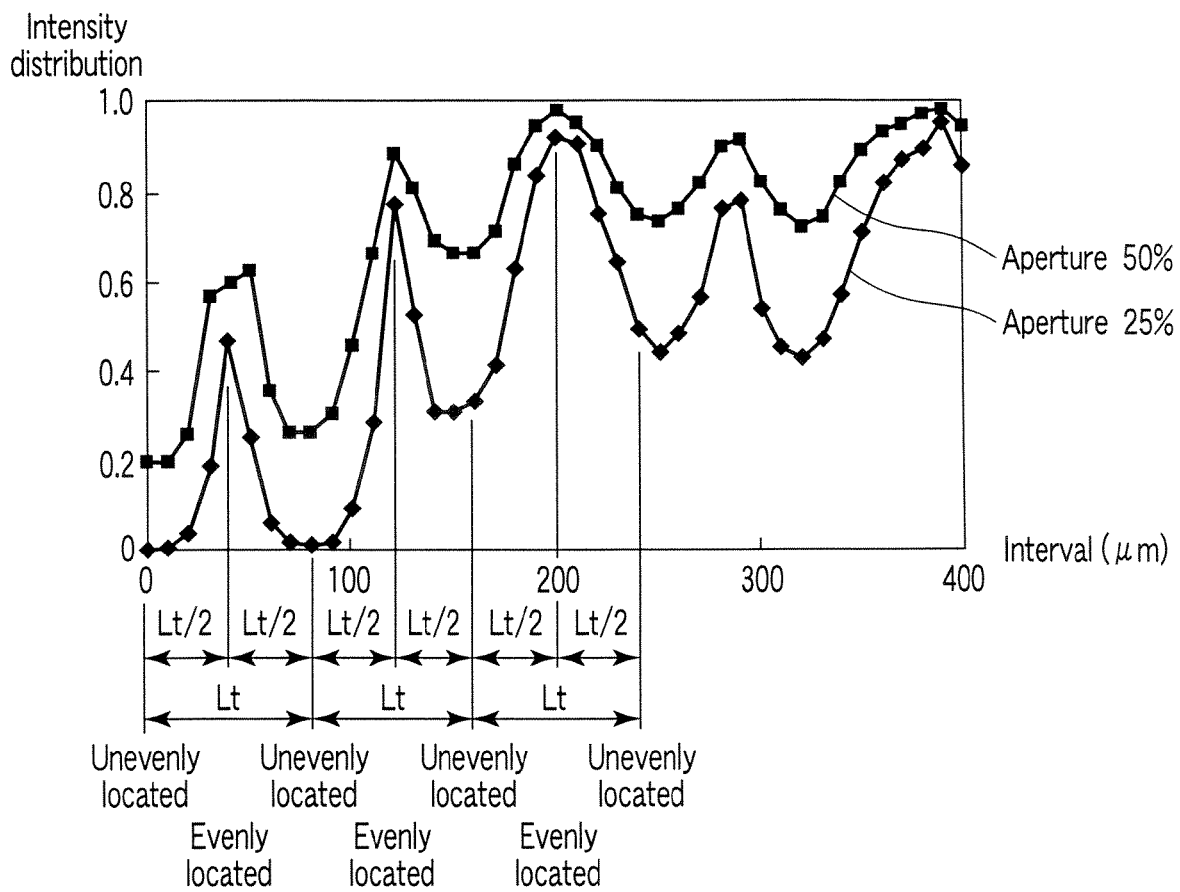
FIG. 12
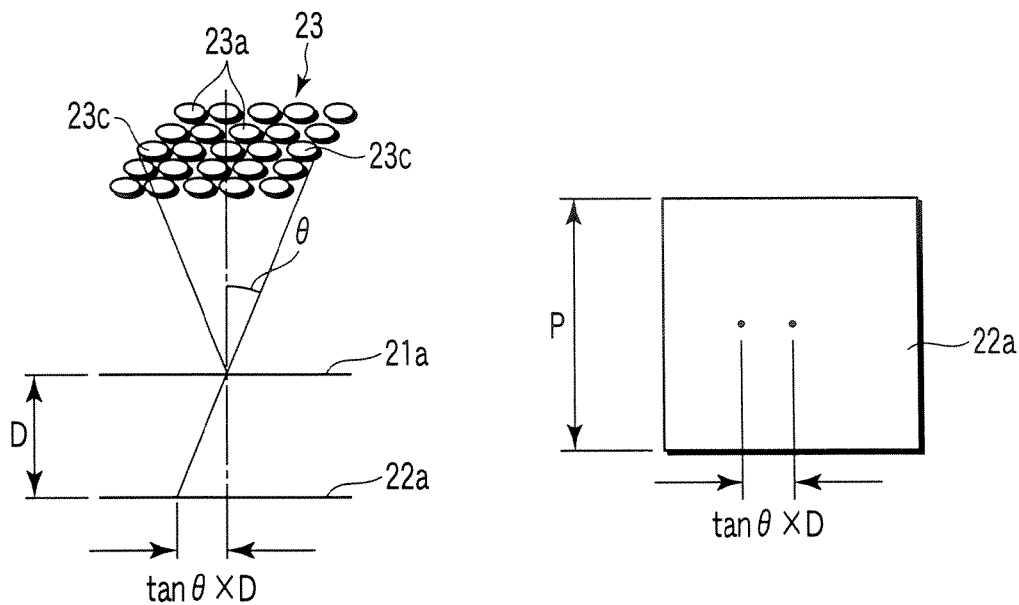
FIG. 13A
FIG. 13B

Light intensity (relative value)

Distance (μm)

Light intensity (relative value)

Distance (μm)

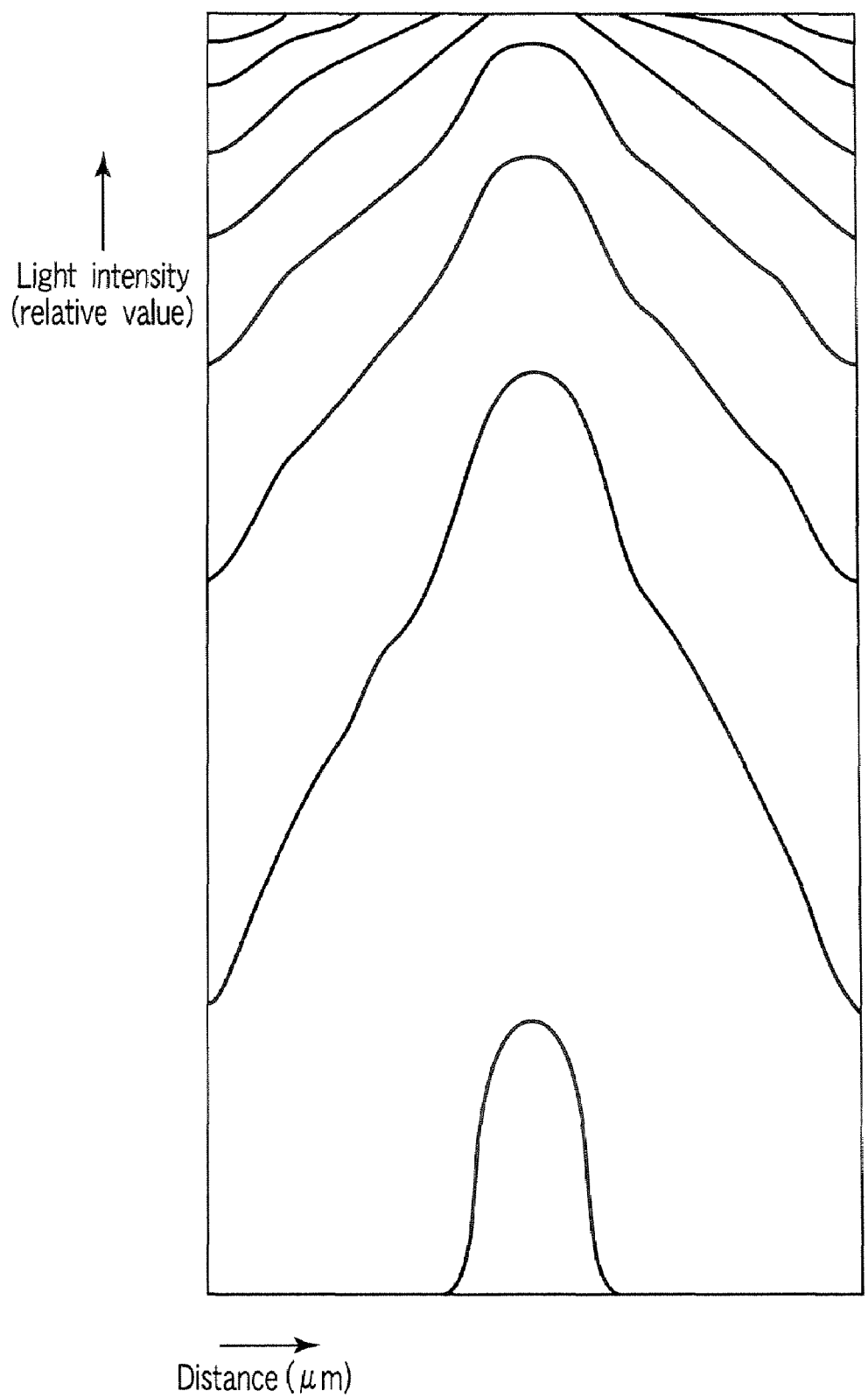
F I G. 17

GENERATION METHOD OF LIGHT INTENSITY DISTRIBUTION, GENERATION APPARATUS OF LIGHT INTENSITY DISTRIBUTION, AND LIGHT MODULATION ELEMENT ASSEMBLY

CROSS-REFERENCE TO RELATED APPLICATIONS

This application is based upon and claims the benefit of priority from prior Japanese Patent Application No. 2005-031188, filed Feb. 8, 2005, the entire contents of which are incorporated herein by reference.

BACKGROUND OF THE INVENTION

1. Field of the Invention

The present invention relates to a generation method of a light intensity distribution, a generation apparatus of a light intensity distribution and a light modulation element assembly; for example, the present invention relates to measurement of a light intensity distribution of light applied to a predetermined flat surface or plane in a light intensity distribution generation apparatus used in a crystallization apparatus.

2. Description of the Related Art

In recent years, there has been developed a technology which uses a laser beam to perform a wide variety of processing such as free-form curve cutting, boring, welding, surface finishing, microfabrication or the like with respect to various kinds of materials such as iron, non-ferrous metals, ceramics, plastics, wood, fabrics, paper, and composite materials. For example, surface fishing processing is processing which irradiates a surface of a material with a laser beam having a relatively low energy density to heat a surface part only, thereby reforming the heated part. In this surface finishing processing, there are cases where the surface part is processed in a solid state and where the surface part is fused to be processed.

In a display device such as an active matrix type liquid crystal display device or an organic electroluminescent display device, many thin film transistors [TFTs] are formed on an insulating substrate such as glass or plastic in order to individually drive pixels for display. An amorphous silicon (a-Si) film in which source, drain and channel regions of a TFT has a low formation temperature, can be relatively easily formed by a gas phase method and is superior in mass productivity. Therefore, this film is generally used as a semiconductor film utilized for the TFT.

Such an amorphous silicon film has a drawback that its physical properties, e.g., electrical conductivity, are inferior to those of a poly-silicon (p-Si) film (the mobility of a-Si is two or more digits lower than that of p-Si). Therefore, in order to increase an operating speed of the TFT, there is used a technology which forms an a-Si film, changes this a-Si film into a p-Si film and forms source, drain and channel regions of the TFT in this polycrystal silicon film, e.g., an annealing method (Excimer Laser Annealing; which will be referred to as an "ELA method" hereinafter) using an excimer laser. Since this ELA method can be carried out in a temperature range where a general-purpose glass substrate can be used, i.e., a temperature range from a room temperature to approximately 500° C., it has the advantage that the material of the substrate is not restricted.

The ELA method is, e.g., a crystallization method which deposits an a-Si film on a substrate to provide a predetermined thickness (e.g., a thickness of approximately 50 nm), and then irradiates this a-Si film with a laser beam such as a krypton fluorine (KrF) excimer laser beam having a wavelength of 248 nm or a xenon chlorine (XeCl) excimer laser beam having a wavelength of 308 nm to locally fuse/recrystallize the a-Si film in an irradiated region, whereby the a-Si film is changed into a p-Si film.

The ELA method can be adapted to any other various processes by appropriately selecting an average intensity (a fluence) of a laser beam. For example, when a laser beam is set to an intensity with which a heating function alone is demonstrated, the ELA method can be used for an impurity activation step of a TFT. Further, when the intensity of a laser beam is set to be extremely large, a sudden increase in temperature is provoked, and hence the ELA method can be also utilized for removal of a film in the TFT. Furthermore, utilization of these phenomena is not restricted to the TFT and can be extensively adapted to a semiconductor manufacturing process.

In a display device such as a liquid crystal display device or an organic electroluminescent display device, when a TFT is formed in a p-Si film in order to increase operating speed, crystal grain boundaries of the p-Si film exist in a channel region of the TFT. In this case, the number of the crystal grain boundaries formed in the channel region differs in accordance with each TFT, and hence this difference in the number of the crystal grain boundaries considerably increases irregularities in characteristics such as threshold voltage or a mobility of each TFT. Such irregularities in threshold value in each TFT greatly lower operating characteristics of the entire display device, which can be a factor deteriorating a picture quality or the like.

Therefore, there has been a demand for equalizing the number of crystal grain boundaries in a channel region of each TFT as much as possible or eliminating crystal grain boundaries from the channel region of each TFT thus it is desired to form a crystallized region having a large particle or grain diameter and controlling a crystallized region forming position so that the TFT can be formed in the crystallized region. The present inventors have carried out development with respect to such a demand, whereby a crystallized region having a large particle diameter can be manufactured by using a light modulation element (see Jpn. Pat. Appln. KOKAI Publication No. 2004-186449 and Jpn. Pat. Appln. KOKAI Publication No. 2004-193229).

Jpn. Pat. Appln. KOKAI Publication No. 2004-186449 reveals that, in development of industrialization of this technology, evaluation and management of a light intensity distribution of a laser beam which is applied to an a-Si film as a crystallization processing target body in an accuracy of submicron order are very important in an increase in grain diameter and positional control of a crystallized region. Especially, in a mass production line, periodical monitoring of a light intensity distribution is important in order to use a laser beam source which relatively has a problem in output stability. However, since the light intensity distribution has a fine structure of a submicron level and an excimer laser beam preferable for crystallization is invisible, there is a problem that monitoring with the naked eye of an operator is difficult.

Therefore, the present inventors have carried out development for visualization of a light intensity distribution to obtain an apparatus having a configuration in which an original light modulation element and another light modulation element called a visualization mask are provided in a laser beam path of a crystallization apparatus. The apparatus irradiates an a-Si film with a laser beam to perform crystallization with a large particle diameter. The a-Si film is irradiated with a light-modulated laser beam through these two light modulation elements, thereby realizing visualization. This visualization apparatus fuses an irradiation target surface of an a-Si film by application of a laser beam. A fused region is crystallized in a temperature reducing process when the laser beam is interrupted. Physical properties of the thus formed crystallized region are changed. A method of utilizing this change in physical properties to visualize a light intensity distribution has been developed. The present inventors have released an optical system as means for accurately measuring a light intensity distribution in an internal academic conference (IDW'04, Proceedings of the Eleventh International Display Workshops).

In general, as a method of generating a predetermined light intensity distribution, there are methods of aligning an element pattern which modulates an optical amplitude, an element pattern which modulates an optical phase, and an element pattern which modulates both an optical amplitude and an optical phase while changing a modulation quantity. Here, reducing a size of the element pattern to be smaller than a point spread range of an image forming optical system can remove a shape of the element pattern from a light intensity distribution to be generated, thereby realizing a smooth distribution. That is, just performing binary processing of the light modulation element can generate a light intensity distribution having a predetermined gradation.

Here, as shown in FIGS. 19A and 19B, a consideration will now be given on a light intensity distribution which is generated when two light modulation elements (a first light modulation element [FIG. 19A] and a second light modulation element [FIG. 19B]) having one-dimensional patterns orthogonal to each other are superimposed without a gap therebetween. Even if a relative position of the two light modulation elements is shifted, since an overlap pattern itself is not changed as shown in FIG. 19C, a light intensity distribution to be generated is laterally shifted as a whole but not changed. On the other hand, as shown in FIGS. 20A and 20B, where both light modulation elements have two-dimensional patterns or at least one of the two light modulation elements has a two-dimensional pattern although not shown, shifting of a relative position of the two light modulation elements changes an overlap pattern as shown in FIGS. 20C and 20D and also varies a light intensity distribution to be generated.

For example, it is assumed that the first and the second light modulation elements shown in FIGS. 20A and 20B are an optical amplitude type light modulation element and a hatched part in the figures indicates a light shielding region whilst a blank part indicates a transmission region. In this case, the transmission region does not exist in an overlap pattern in a FIG. 20C state where the two light modulation elements are superimposed. In the other hand, relatively large openings (the transmission regions) are generated in the overlap pattern by half-pitch shifting of an element pattern in a FIG. 20D state where the two light modulation elements are superimposed. In these two different superimposed states, it can be expected that light intensity distributions to be generated are also greatly different from each other.

Moreover, when a relative angle (a rotating angle around an axial line vertical to a page space of FIGS. 20A and 20B) of the first and second light modulation elements is changed, the overlap pattern differs depending on each position. Thus results in a change, i.e., irregularities in the light intensity distribution to be generated depending on each position. Additionally, if a pitch of the element pattern is slightly different between the first and second light modulation elements, irregularities with a large cycle are generated in a light intensity distribution to be generated. Further, even if each of the first and second light modulation elements is an optical phase type light modulation element, and even if one of the light modulation elements is an optical amplitude type light modulation element and the other one is an optical phase type light modulation element, a change or irregularities are likewise generated in the light intensity distribution. It has been revealed that such a change or irregularities in light intensity distribution are apt to be produced when an area modulation type phase shifter which can be readily designed as a light modulation pattern is used.

Furthermore, although the element patterns are the same in a plane in FIGS. 20A and 20B, when the element patterns vary in a plane, it can be understood from considerations that the light intensity distribution to be generated is changed in accordance with relative displacement or the like of the two light modulation elements. In this specification, a phenomenon that irregularities or a change is generated in a light intensity distribution to be produced in accordance with relative displacement or the like of the two light modulation elements in this manner is called the "Moire effect". In the measuring method and the measuring apparatus of a light intensity distribution proposed in the above-described patent application, a desired two-dimensional light intensity distribution cannot be generated due to an influence of the Moire effect caused by relative displacement or the like of two light modulation elements, and a light intensity distribution formed by a measurement target light modulation element alone cannot be accurately measured.

BRIEF SUMMARY OF THE INVENTION

It is an object of the present invention to rapidly and accurately measure a light intensity distribution formed on a predetermined flat surface based on a single application of light and an evaluation of a change in physical properties without being substantially affected by a moire phenomenon due to relative displacement or the like of two light modulation elements.

According to a first aspect of the present invention, there is provided a generation method of a light intensity distribution, which uses a first light modulation element and a second light modulation element which are arranged to be apart from each other by a distance D and face each other in parallel to optically modulate a light beam which enters the light modulation elements, thereby generating a light intensity distribution on a target surface, wherein the first light modulation element has a pattern formed by repeating a basic unit having a pitch P, and the distance D is set to a distance with which the light intensity distribution generated on the predetermined surface is not changed even if a relative position of the first light modulation element and the second light modulation element is shifted in a plane direction is provided.

According to a preferred embodiment of the present invention, there may be provided a generation apparatus of a light intensity distribution, comprising a plurality of light modulation elements to modulate a light beam which enters the light modulation elements, thereby generating a light intensity distribution on a target surface, the pair of light modulation elements including a first light modulation element and a second light modulation element which are arranged to be apart from each other by a distance D and face each other in parallel, wherein the first light modulation element has a pattern formed by repeating a basic unit having a pitch P, and the distance D is set to a distance with which a light intensity distribution generated on the target surface is not changed even if a relative position of the first light modulation element and the second light modulation element is shifted in a plane direction is provided.

According to the preferred embodiment, the distance D may satisfy the following condition:

$$D \approx P^2(2n+1)/2\lambda$$

where $\lambda$ is a wavelength of the light beam, and n is an integer equal to or above 0 (0, 1, 2, 3 . . . ) is provided.

According to the preferred embodiment, the distance D may satisfy the following condition:

$$\tan\theta \times D \approx m \times P/2$$

where θ is a maximum value of an incidence angle of the light beam along a pitch direction with respect to the first light modulation element, and m is an integer equal to or above 1 (1, 2, 3...) is provided.

According to the preferred embodiment, the device may further comprise an image forming optical system which image-forms the light beam from the first light modulation element and the second light modulation element on the target surface is provided.

According to the preferred embodiment, the pitch P of the basic unit of the first light modulation element may be smaller than a point spread range of the image forming optical system is provided.

According to the preferred embodiment, the second light modulation element preferably has a pattern formed by repeating a basic unit having a pitch is provided.

According to the preferred embodiment, the pitch of the basic unit of the second light modulation element may be smaller than the point spread range of the image forming optical system is provided.

According to the preferred embodiment, the device may further comprise a member which supports a physical property changing member of which one surface is set to the target surface and whose physical properties change in accordance with an intensity of incident light, wherein the light intensity distribution as a combined light intensity distribution of a first light intensity distribution which is formed on the target surface by the first light modulation element and one-dimensionally changes along directions orthogonal to each other and a second light intensity distribution formed on the target surface by the second light modulation element is formed on the physical property changing member, and the first light intensity distribution or the second light intensity distribution is measured based on two-dimensional information of a change in physical properties of the physical property changing member is provided.

According to the preferred embodiment, the physical property changing member may be an amorphous silicon film is provided.

According to the preferred embodiment, a boundary between a region which has changed from the amorphous silicon film into a polycrystal silicon film and a region which has remained as the amorphous silicon film on the physical property changing member may be imaged, and the first light intensity distribution or the second light intensity distribution may be measured based on information of the imaged boundary.

According to the preferred embodiment, the device may further comprise: a processing target body of which one surface is set to the target surface and has a non-single-crystal semiconductor film; and a supporting member for supporting the processing target body, wherein the non-single-crystal semiconductor film is irradiated with the combined light intensity distribution of the first light intensity distribution and the second light intensity distribution, thereby crystallizing the non-single-crystal semiconductor film is provided.

According to a further preferred embodiment, there may be provided a light modulation element unit comprising a first light modulation element and a second light modulation element which are arranged to be apart from each other by a distance D and face each other in parallel, wherein the first light modulation element has a pattern formed by repeating a basic unit having a pitch P, and the distance D satisfies the following condition:

$$D \approx P^2(2n+1)/2\lambda$$

where λ is a wavelength of light, and n is an integer equal to or above 0 (0, 1, 2, 3...) is provided.

According to a still further preferred embodiment, there may be provided a light modulation element assembly comprising a first light modulation element and a second light modulation element which are arranged to be apart from each other by a distance D and face each other in parallel, wherein the first light modulation element has a pattern formed by repeating a basic unit having a predetermined pitch P, and the distance D satisfies the following condition:

$$\tan\theta \times D \approx m \times P/2$$

where θ is a maximum value of an incidence angle of light along a pitch direction with respect to the first light modulation element, and m is an integer equal to or above 1 (1, 2, 3...) is provided.

In the present embodiment, the interval between the first and second light modulation elements may be set to substantially satisfy predetermined conditions in order to substantially uniform both amplitude and phase of the light distribution generated on the modulation surface of the second light modulation element by the first light modulation element. As a result, the light intensity distribution formed on a predetermined flat surface can be rapidly and accurately measured based on a single application of light and evaluation of the change in physical properties without being substantially affected by the Moire effect due to relative displacement or the like of the two light modulation elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 6A to 6C are views showing how a combined light intensity distribution is formed on a surface of the sample substrate by the light modulation element and the visualization mask in the apparatus depicted in FIG. 4;

FIGS. 7A and 7B are views illustrating a basic concept which eliminates occurrence of a moire effect due to relative displacement of a first light modulation element and a second light modulation element;

FIG. 12 is a view obtained by adding an effect of a Fourier image in FIG. 10 showing the relationship between the interval between the first and second light modulation elements and the light intensity distribution of the Moire map;

FIGS. 13A and 13B are views illustrating basic points of a shift effect by illumination light flux;

FIG. 17 is a view showing in contour a light intensity distribution obtained on a sample substrate when an interval between a light modulation element and a visualization mask is set to a predetermined value in an embodiment according to the present invention;

DETAILED DESCRIPTION OF THE INVENTION

Figure 1:
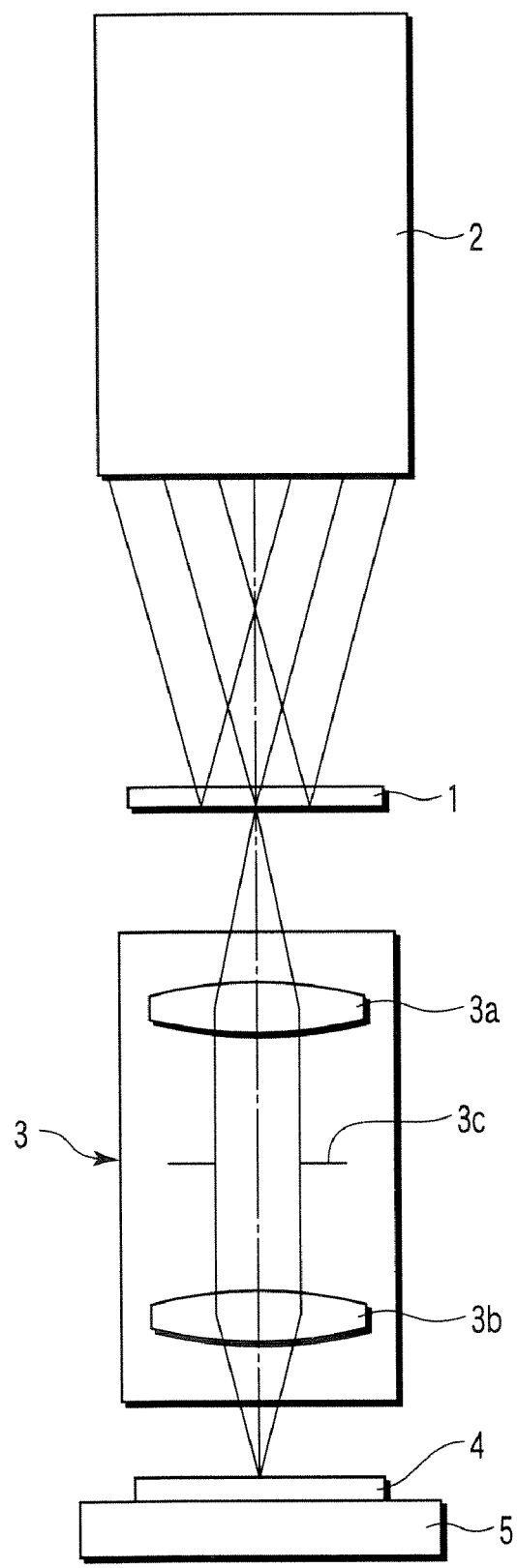
FIG. 1 is a view schematically showing a configuration of a crystallization apparatus in order to explain a generation method of a light intensity distribution according to an embodiment of the present invention.
Figure 2:
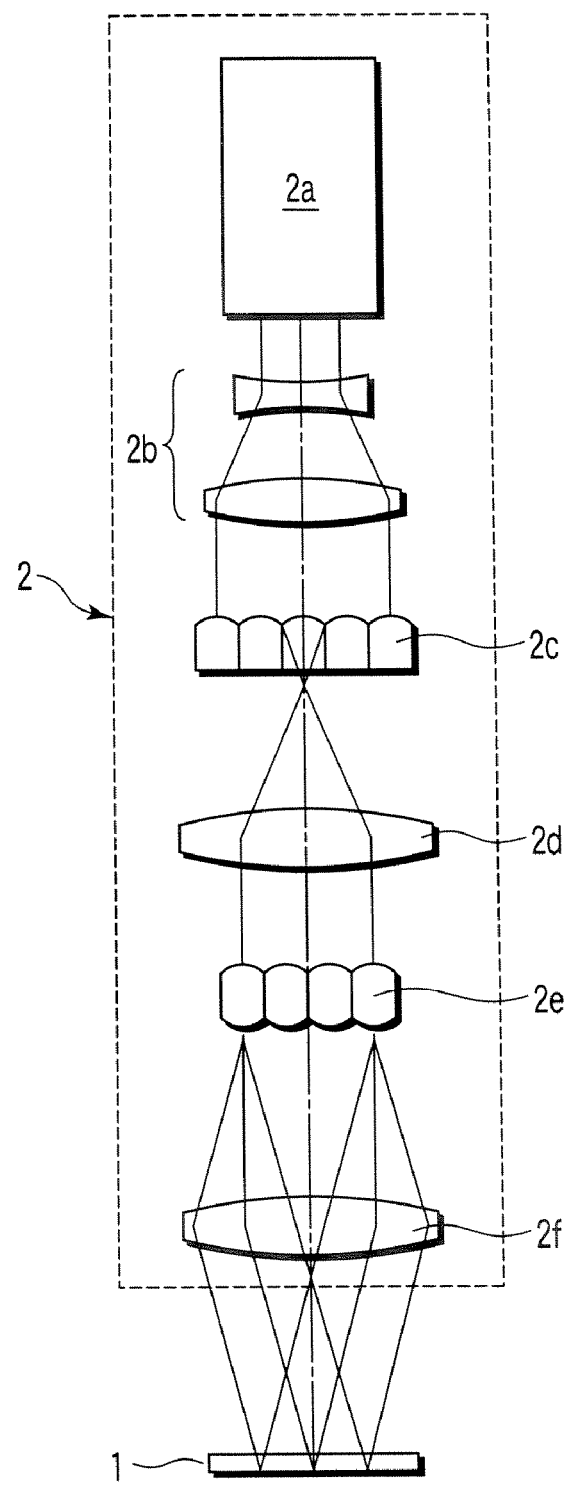
FIG. 2 is a view schematically showing an internal configuration of an illumination system of the crystallization apparatus depicted in FIG. 1.

An embodiment in which a generation method of a light intensity distribution according to the present invention is applied to a crystallization apparatus will now be described with reference to the accompanying drawings. FIG. 1 is a view schematically showing a configuration of crystallization by a crystallization apparatus. Further, FIG. 2 is a view schematically showing an internal configuration of an illumination system of the crystallization apparatus depicted in FIG. 1. Referring to FIGS. 1 and 2, a crystallization configuration of the crystallization apparatus includes: a light modulation element 1 which modulates a phase of an incident light beam to form a light beam having a light intensity distribution which varies along one direction, and is formed of a phase shifter; an illumination system 2 which emits a light beam or a laser beam which illuminates the light modulation element 1; an image forming optical system 3; and a substrate stage 5 which holds a processing target substrate 4.

A configuration and a function of the light modulation element 1 will be described later. As shown in FIG. 2, the illumination system 2 is provided with an XeCl excimer laser beam source as a light source 2a which supplies a laser beam having a crystallization energy, e.g., light having a wavelength of 308 nm. As this light source 2a, it is possible to use any other appropriate laser beam source like a KrF excimer laser beam source having performance of emitting an energy light beam which fuses a crystallization processing target body. The laser beam emitted from the light source 2a is subjected to diameter expansion by a beam expander 2b and then enters a first fly-eye lens 2c.

As a result, a plurality of small light sources are formed on a rear focal plane of the first fly-eye lens 2c, and light fluxes or beamlets from these small light sources illuminate an incidence surface of a second fly-eye lens 2e in an overlapping manner through a first condenser optical system 2d. As a result, more small light sources are formed on a rear focal plane of the second fly-eye lens 2e than those on the rear focal plane of the first fly-eye lens 2c. Light fluxes from the small light sources formed on the rear focal plane of the second fly-eye lens 2e illuminate the light modulation element 1 in an overlapping manner through a second condenser optical system 2f.

The first fly-eye lens 2c and the first condenser optical system 2d constitute a first homogenizer. This first homogenizer homogenizes the laser beam emitted from the light source 2a in relation to an incidence angle on the light modulation element 1. Further, the second fly-eye lens 2e and the second condenser optical system 2f constitute a second homogenizer. This second homogenizer homogenizes the laser beam whose incidence angle has been homogenized by the first homogenizer in relation to a light intensity at each in-plane position on the optical modulation element 1.

In this manner, the illumination system 2 irradiates the light modulation element 1 with the laser beam having a light intensity distribution of a substantially homogeneous light intensity. The laser beam subjected to phase modulation by the light modulation element 1 enters the processing target substrate 4 through the image forming optical system 3 having a reducing magnification of, e.g., ⅕. Here, the image forming optical system 3 provided in a transmission optical path of the light modulation element 1 has a modulation surface of the light modulation element 1 and the processing target substrate 4 arranged in an optically conjugate manner. In other words, the processing target substrate 4 which is provided in the transmission optical path of the image forming optical system 3 and subjected to crystallization processing is set to a surface which is optically conjugate with the modulation surface of the optical modulation element 1 (an image surface of the image forming optical system 3).

As shown in FIG. 1, the image forming optical system 3 includes an aperture stop 3c between a positive lens assembly 3a and a positive lens assembly 3b. A size of an aperture portion (a light transmitting portion) of the aperture stop 3c (i.e., an image side numerical aperture NA of the image forming optical system 3) is set to generate a necessary light intensity distribution on an upper or target surface of a semiconductor film of the processing target substrate 4. This image forming optical system 3 may be a refractive optical system, or a reflective optical system, or a refractive/reflective optical system.

The processing target substrate 4 is configured by forming a lower layer insulating film, a non-single-crystal semiconductor film and an upper layer insulating film in the mentioned order on an arbitrary substrate of, e.g., an insulator, a semiconductor, a metal or the like. Specifically, the processing target substrate 4 is obtained by sequentially forming an underlying insulating film, a non-single-crystal semiconductor film, e.g., an amorphous silicon film (a-Si film) and a cap film as an upper layer insulating film on a liquid crystal display glass sheet as a substrate by a chemical vapor deposition (CVD) method. Each of the underlying insulating film and the cap film is an insulating film of, e.g., $SiO_2$. The underlying insulating film avoids diffusing and mixing of a foreign particle such as Na into the a-Si film caused due to direct contact of the a-Si film and the glass substrate, and prevents heat of the a-Si film from being directly transmitted to the substrate such as a glass substrate.

The a-Si film is a semiconductor film to be crystallized. The cap film is heated by a part of a light beam which enters the a-Si film, and stores the heated temperature. Although a temperature of a high-temperature portion is relatively rapidly reduced on an irradiation target surface of the a-Si film when incidence of the light beam is interrupted, this thermal storage effect alleviates this temperature reducing gradient and facilitates lateral crystal growth with a large particle diameter. The processing target substrate 4 is positioned and held at a predetermined position on the substrate stage 5 by, e.g., a vacuum chuck or an electrostatic chuck.

Figure 3A:
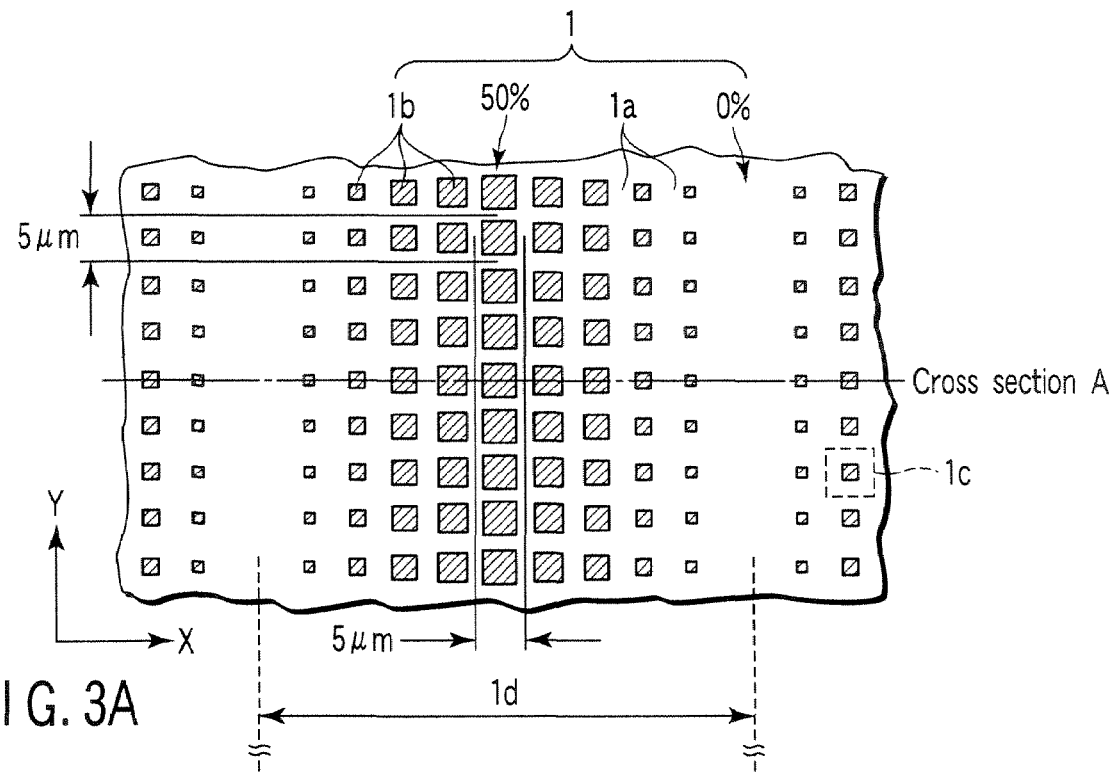
FIG. 3A is a view showing a configuration of a phase pattern of a light modulation element of the crystallization apparatus depicted in FIG. 1.
Figure 3B:
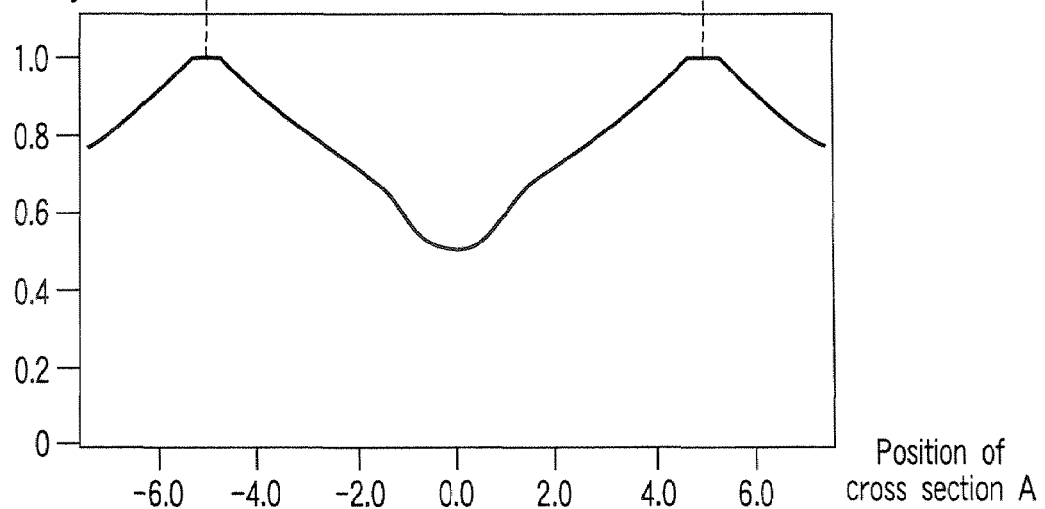
FIG. 3B is a view schematically showing a light intensity distribution formed on a processing target substrate by the crystallization apparatus using a light modulation element depicted in FIG. 3A.

FIG. 3A is a view showing a configuration of a phase pattern of the light modulation element as one example in the crystallization apparatus depicted in FIG. 1, and FIG. 3B is a view schematically showing a light intensity distribution formed on the processing target substrate by the crystallization apparatus using the light modulation element depicted in FIG. 3A. The light modulation element 1 is constituted of many units aligned in a direction X. Each unit (a unit region in a range indicated by 1d) has a reference phase region (indicated by a blank portion in the figure) 1a having a reference phase value of 0 degree and each rectangular modulation phase region (indicated by a hatched portion in the drawing) 1b having a modulation phase value of 90 degrees as shown in FIG. 3A. Here, the modulation phase regions 1b are arranged lengthwise and crosswise in accordance with a predetermined pitch while changing each area along the direction X (a horizontal direction in the figure).

In the modulation phase regions, an area share ratio (a duty) of the modulation phase region 1b with respect to a square unit cell 1c of 5 μm×5 μm varies between 0% and 50% along the direction X (along a cross section A). Specifically, the area share ratio of the modulation phase region 1b at the center of a phase pattern repeated unit region 1d is 50%, the area share ratio of the modulation phase region 1b on each of both sides of the repeated unit region 1d is 0%, and the area share ratio of the modulation phase region 1b monotonously varies between these regions. It is to be noted that the unit cell 1c has a dimension which is not greater than a point spread range of the image forming optical system 3.

When such an optical phase type light modulation element or phase shifter 1 is used, as shown in FIG. 3B, a V-shaped light intensity distribution which varies along one direction corresponding to a direction of the cross section A is formed on the surface of the processing target substrate 4 arranged at the image surface position of the image forming optical system 3. That is, there is formed the V-shaped light intensity distribution in which the light intensity is minimum in accordance with a position of the cross section A where the area share ratio of the modulation phase region 1b is 50% and the light intensity is maximum in accordance with a position of the cross section A where the area share ratio of the modulation phase region 1b is 0%. FIG. 3B shows at the center one V-shaped light intensity distribution alone which corresponds to the phase pattern repeated unit region 1d of a plurality of V-shaped light intensity distributions which are continuously formed along the direction of the cross section A.

In this crystallization apparatus, a temperature gradient is generated in a fused region in a light irradiation region on the processing target substrate 4 in accordance with the V-shaped light intensity distribution. A crystal nucleus is formed at a part which is solidified first or a part which is not fused in a region having the minimum light intensity or a region in the vicinity thereof. Thus, a crystal grows in a lateral direction from the crystal nucleus toward the periphery along a light intensity changing direction in the V-shaped light intensity distribution. A crystal grain with a large particle diameter is generated. As described above, in order to increase a particle diameter of a crystal grain (a crystallized region), uniform sizes of crystal grains and control positions of the crystal grains, it is important to accurately measure the distribution of the light intensity with which the a-Si film of the processing target substrate 4 is irradiated and confirm that a desired light intensity distribution is actually formed on the a-Si film by a function of the light modulation element 1.

Figure 4:
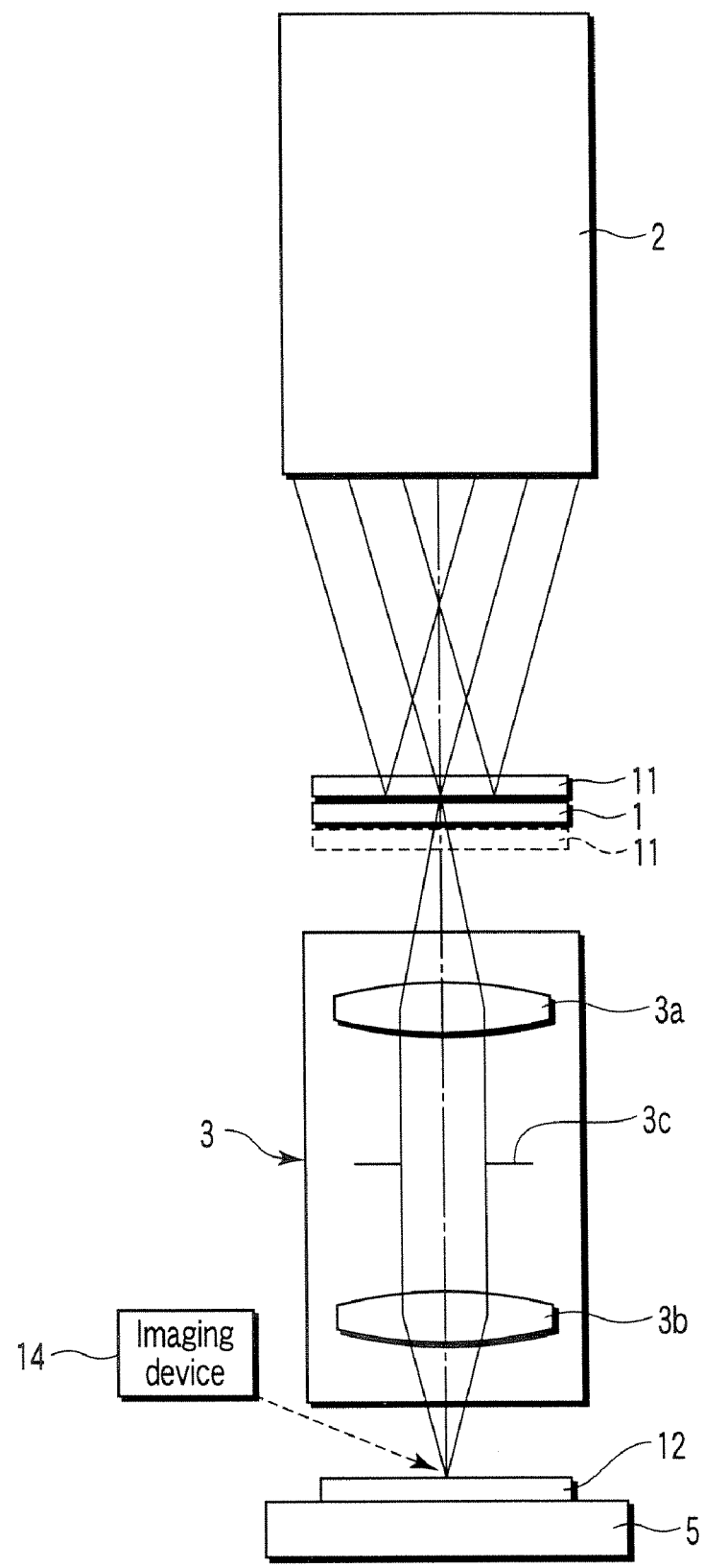
FIG. 4 is a view schematically showing an apparatus which carries out a measurement method concerning a generation method of a light intensity distribution according to an embodiment of the present invention.

Thus, in the crystallization apparatus according to this embodiment, a second light modulation element or a visualization mask 11 is arranged in close proximity to the light source 2a side of the first light modulation element 1 as indicated by solid lines in FIG. 4 (or the image forming optical system 3 side as indicated by dotted lines) in an incidence optical path or an exit optical path of the first element 1, and a sample substrate 12 is mounted on the substrate stage 5 in place of the processing target substrate 4. The first and second modulation elements 1, 11 are separated from each other with a later-described distance D therebetween and integrally constituted. That is, they may be arranged as a unit or separately arranged. According to the measurement method of this embodiment, in such am optical system, a laser beam of a single shot is emitted from the light source 2a, the visualization mask 11 and the optical modulation element 1 form on the sample substrate 12 a combined light intensity distribution formed on the image surface of the image forming optical system 3 and visualize the light intensity distribution which is formed from a change in state (a change in physical properties) of this sample substrate 12 by the first light modulation element 1 alone.

Here, the visualization mask 11 is an optical amplitude type light modulation element which modulates an amplitude of an incident light beam to form a light beam having a light intensity distribution which monotonously changes in one direction. The second element 11 is arranged in such a manner that a pattern surface of the first light modulation element 1 faces a pattern surface of the visualization mask or second light modulation element 11 in parallel. Moreover, the light modulation element (a measurement target light modulation element) 1 and the visualization mask (a measurement light modulation element) 11 are positioned in such a manner that a direction along which a light intensity distribution formed by the light modulation element 1 varies becomes orthogonal to a direction along which a light intensity distribution formed by the visualization mask 11 varies.

The sample substrate 12 has a physical property changing member or a physical property changing film whose physical properties vary in accordance with an intensity of incident light. As this physical property changing member, it is possible to use a change in physical properties or chemical properties of not only an amorphous silicon film as a crystallization target film and a fluorescent material but also any other material (e.g., a photoresist). Additionally, as the physical property changing member, it is desirable to use a member whose physical properties vary in a visible light region with a resolution of submicron order in accordance with an intensity of incident light.

Figure 5A:
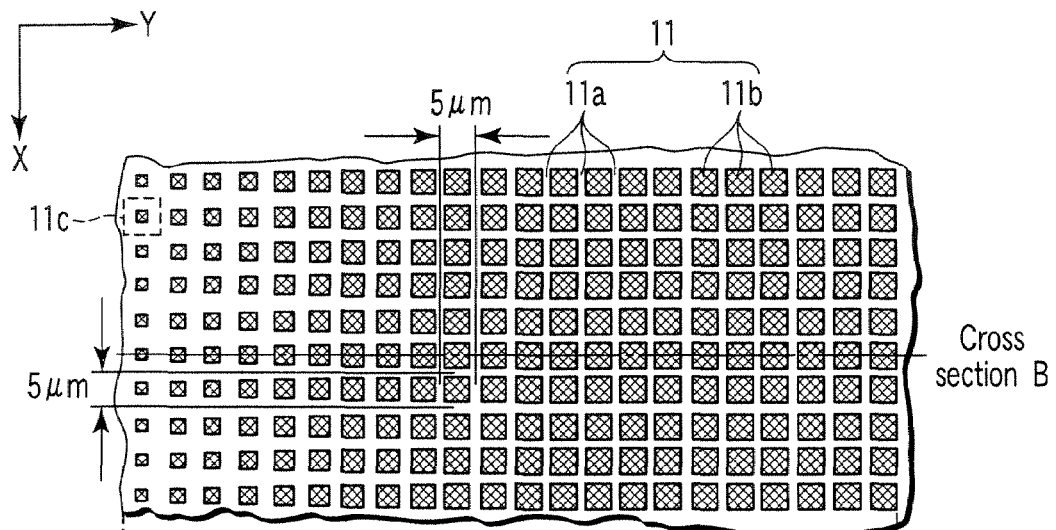
FIG. 5A is a view showing a configuration of a pattern of a visualization mask of the apparatus depicted in FIG. 4.
Figure 5B:
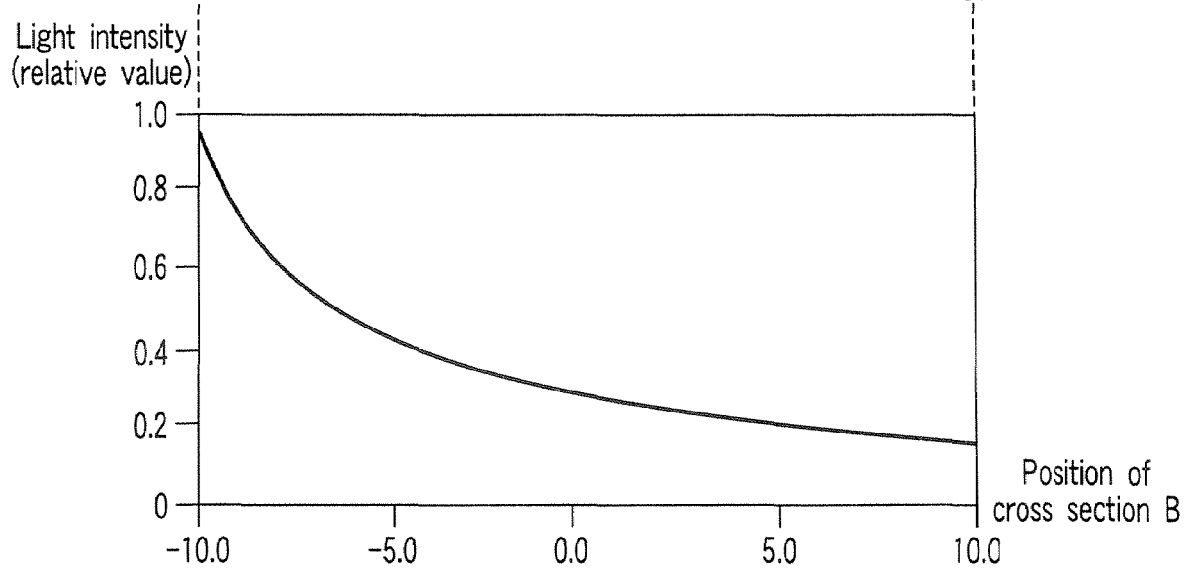
FIG. 5B is a view schematically sowing a light intensity distribution formed on a sample substrate by using the visualization mask depicted in FIG. 5A.

FIG. 5A is a view showing a configuration of a pattern of the visualization mask 11 in the apparatus depicted in FIG. 4, and FIG. 5B is a view schematically showing a light intensity distribution formed on the sample substrate by using the visualization mask depicted in FIG. 5A. As shown in FIG. 5A, each unit (a unit region) of the visualization mask 11 has a light transmitting region (indicated by a blank portion in the figure) 11a where a transmission factor of light is substantially one and each rectangular light shielding region (indicated by a black portion in the drawing) 11b where a transmission factor of light is substantially zero. Here, the light shielding regions 11b are constituted by forming light shielding films made of, for example, aluminum or chrome on a transparent substrate e.g., a quartz glass substrate, and arranged lengthwise and crosswise in accordance with a predetermined pitch while changing each area along a direction Y (a horizontal direction in the figure).

An area share ratio (a duty) of the light shielding region 11b with respect to a square unit cell 11c of 5 μm×5 μm monotonously varies along the direction Y (along a cross section B). The unit cell 11c has a dimension which is not greater than the point spread range of the image forming optical system 3. When the visualization mask 11 alone is utilized without using the first light modulation element 1, as shown in FIG. 5B, a light intensity distribution which monotonously varies along one direction corresponding to a direction of the cross section B is formed on a surface (an upper surface) of the sample substrate 12 set at the image surface position of the image forming optical system 3.

In this embodiment, the light modulation element 1 and the visualization mask 11 are arranged in such a manner that a changing direction (the direction X) of the V-shaped light intensity distribution formed on the sample substrate 12 by a function of the light modulation element 1 becomes orthogonal to a changing direction (the direction Y) of the light intensity distribution formed on the surface of the sample substrate 12 by a function of the visualization mask 11. As an example of a design of the visualization mask 11, the visualization mask 11 is constituted in such a manner that a light intensity distribution g(y) formed on the surface of the sample substrate 12 by the function of the visualization mask 11 can be expressed as $g(y)=\alpha/y$. Here, $\alpha$ is a known coefficient which determines a distribution shape of the light intensity.

Therefore, a combined light intensity distribution I(x, y) shown in FIG. 6C of a V-shaped light intensity distribution f(x) formed on the surface of the sample substrate 12 by the function of the first light modulation element 1 as shown in FIG. 6A and the light intensity distribution $g(y)=\alpha/y$ formed on the surface of the sample substrate 12 by the function of the visualization mask 11 as shown in FIG. 6B can be represented by the following Expression (1):

$$I(x, y) = f(x) \times g(y) \quad (1)$$
$$= \alpha \cdot f(x)/y$$

The sample substrate 12 is a substrate used to measure, monitor or manage a light intensity distribution. An amorphous silicon film (an a-Si film) having a thickness of, e.g., 50 nm is formed therein at the upper surface thereof. In this case, the a-Si film of the sample substrate 12 is irradiated with a light beam having the combined light intensity distribution I(x, y), whereby its physical properties vary. Specifically, the a-Si is fused in a region 12ap of an irradiation target region 12a of the sample substrate 12 irradiated with a light beam having a light intensity equal to or greater than a threshold intensity Ic, and the fused a-Si is changed into polycrystal silicon (p-Si) through a recrystallization step after eliminating the incident light, thereby forming a polycrystal silicon film. On the other hand, a region 12aa irradiated with a light beam having a light intensity less than the threshold intensity Ic remains in an a-Si film state.

Here, it can be understood that a boundary 12ac between the region 12ap in which the a-Si film has been physically changed into the p-Si film and the region 12aa which has remained in the a-Si film state is a line region irradiated with a light beam having the threshold intensity Ic. In other words, a relationship represented by the following Expression (2) can be achieved on the boundary 12ac, and a relationship represented by the following Expression (3) can be obtained by modifying Expression (2):

$$I(x, y)=\alpha \cdot f(x)/y=Ic \quad (2)$$

$$y=\{\alpha/Ic\}f(x) \quad (3)$$

Referring to Expression (3), since $\alpha$ (e.g., 20 mJ/cm$^2$) and the threshold intensity Ic of the amorphous silicon film are known constants, it can be understood that a one-dimensional change in the direction x of the V-shaped light intensity distribution f(x) formed on the surface of the sample substrate 12 by the function of the first light modulation element 1 is visualized into two-dimensional information which is the boundary 12ac between the physical property changed region 12ap and the physical property unchanged region 12aa in the irradiation target region 12a of the sample substrate 12 by the function of the visualization mask 11. In this manner, when the boundary 12ac in the square irradiation target region 12a of the a-Si film of the sample substrate 12 is imaged or observed by an imaging device 14 such as an optical microscope shown in FIG. 4, the V-shaped light intensity distribution formed on the surface of the processing target substrate 4 by the function of the light modulation element 1 may be visualized based on information concerning the imaged boundary 12ac.

As described above, according to the measurement method of this embodiment, a change in the V-shaped light intensity distribution f(x) formed by the function of the light modulation element 1 is visualized into the two-dimensional information which is the boundary 12ac on the sample substrate 12 by the function of the visualization mask 11. As a result, the V-shaped light intensity distribution formed on the surface (a predetermined flat surface) of the processing target substrate 4 by the effect of the light modulation element 1 may be rapidly and accurately measured based on of a single application of light and an evaluation of a change in physical properties.

Here, it is very difficult to perform two-dimensional accurate relative positioning of both of the light modulation element 1 having a two-dimensional fine phase pattern and the visualization mask 11 having a two-dimensionally arranged fine brightness pattern along a pattern surface. As described above, when the first light modulation element 1 as the non-measurement target light modulation element and the visualization mask 11 as the measurement light modulation element are not accurately relatively positioned, a desired two-dimensional light intensity distribution cannot be generated on the sample substrate 12 due to an influence of a moire effect caused by relative displacement of the two light modulation elements 1 and 11. Thus, a light intensity distribution formed by the light modulation element 1 alone cannot be accurately measured.

A description will now be given as to a basic concept which eliminates occurrence of the moire phenomenon caused by relative displacement or the like of the two light modulation elements, i.e., the first light modulation element and the second light modulation element. When both an amplitude and a phase become substantially uniform in a modulation unit (which is specifically a unit cell) in a light distribution (which will be referred to as a "second surface light distribution" hereinafter) generated on a modulation surface of the second light modulation element by the first light modulation element, the moire phenomenon does not occur even if a relative position of the second light modulation element in a plane direction (a direction XY) with respect to the first light modulation element. The present inventors have discovered that the second surface light distribution may be substantially uniformed in the modulation unit and occurrence of the moire phenomenon can be substantially eliminated by setting a distance or an interval between the first and second light modulation elements to a predetermined value as will be described later.

Referring to FIG. 7A, in accordance with this embodiment, illumination light beam (which is substantially scattered light) is emitted from a light source 23 which is represented as a set of a plurality of small point light sources (corresponding to the plurality of light sources formed on the rear focal plane of the second fly-eye lens 2e) 23a to a second light modulation element (corresponding to the visualization mask 11) 21 arranged apart from a first light modulation element (corresponding to the light modulation element 1) 22. A second surface light distribution formed by illumination light (which is regarded as parallel light beam) from one light source point 23a is first considered. This second surface light distribution is represented as Fresnel diffraction of light transmitted through each basic unit 21a of the second light modulation element 21. Although the following will describe an example where the second light modulation element 21 and the first light modulation element 22 are arranged in order from the light source side, but an arrangement order will be reversed when the first light modulation element 22 has a pattern formed by repeating a basic unit.

A second surface light distribution formed by illumination light beams from the plurality of small light source points 23a will now be examined. Considering contribution of each of the point light sources 23a, the second surface light distribution by the small light source points 23a may be obtained by moving the second surface light distributions formed by the illumination light beams from the respective small light source points 23a in parallel within the modulation surface of the first light modulation element 22 and adding these distributions in terms of an intensity as shown in FIG. 7B. It can be expected that the second source light distribution varies in accordance with an interval between the first light modulation element 22 and the second light modulation element 21 when the first element 22 is separated from the second element 21 along an optical path (a direction Z), and that the second surface light distribution varies to become uniform as these light modulation elements are separated from each other to some extent from an appressed state.

Figure 8A:
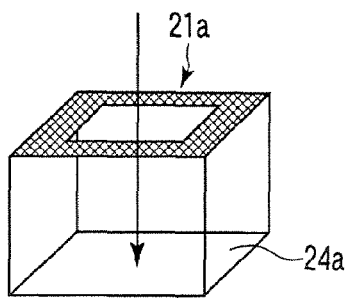
FIGS. 8A to 8D are views illustrating a calculation of a moire effect and a Moire map obtained by the calculation.
Figure 8B:
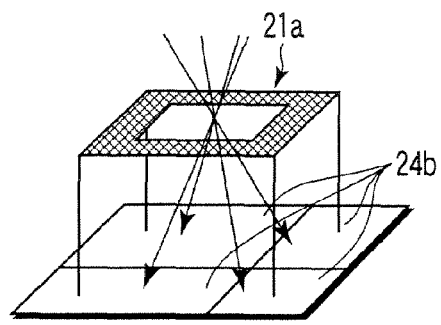

A moire effect will now be obtained in the form of a numerical value. This calculation is important in order to understand a principle of the present invention. First, as shown in FIG. 8A, one basic unit 21a of the second light modulation element 21 is taken out, and a second surface light distribution 24a formed by a parallel light beam (as shown by an arrow) which vertically enters this basic unit 21a is considered. This second surface light distribution 24a is a complex amplitude distribution consisting of an amplitude and a phase. Next, a contribution of the entire light source 23, i.e., contributions of the plurality of small point light sources 23a constituting the light source 23 will be examined. As shown in FIG. 8B, a second surface light distribution 24b formed by light rays or fluxes which obliquely enter the basic unit 21a of the second light modulation element 21 is obtained by shifting the second surface light distribution 24a formed by vertical incidence in a plane by an amount determined by an oblique incidence angle and an interval (a distance) between the second light modulation element 21 and the first light modulation element 22.

Figure 8C:
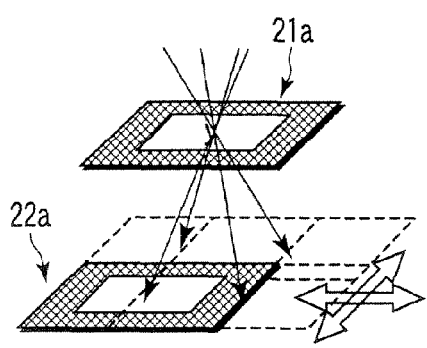

Then, as shown in FIG. 8C, an intensity of light which is transmitted through one basic unit 22a in the modulation surface of the first light modulation element 22 and further "transmitted through" the image forming optical system 3 is obtained. As described above, the basic unit 22a of the first light modulation element 22 is smaller than a resolution of the image forming optical system 3. In this case, zeroth-order light alone is transmitted through the image forming optical system 3, and an intensity of this zeroth-order light is represented by the following Expression (4) provided that Ui is a complex amplitude in the modulation surface (the second surface) of the first light modulation element 22 and Ti is a complex transmission factor of the first light modulation element 22. In Expression (4), i is a number of each small point light source 23a, and x and y represent an orthogonal coordinate system on the modulation surface of the first light modulation element 22.

$$(\text{zeroth} - \text{order light intensity}) = \sum_{i} \left| \int Ui \times Ti \, dx \, dy \right|^2 \quad (4)$$

Figure 8D:
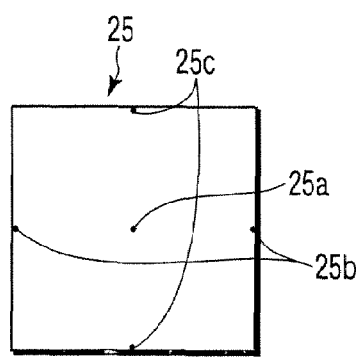

A map 25 shown in FIG. 8D which is obtained by plotting this zeroth-order light intensity, i.e., an intensity on an image surface with respect to a position of the basic unit 22a of the first light modulation element 22 is called a "moire map". A light intensity at a central position 25a in the moire map 25 corresponds to a light intensity when the basic unit 21a of the second light modulation element 21 and the basic unit 22a of the first light modulation element 22 are relatively correctly positioned. Further, a light intensity at each of positions 25b on right and left sides (indicated by a light intensity contour) in the moire map 25 corresponds to a light intensity in a state where the basic unit 21a of the second light modulation element 21 and the basic unit 22a of the first light modulation element 22 are relatively displaced in a lateral direction with a half pitch.

Furthermore, a light intensity at each of positions 25c on upper and lower sides (indicated by the light intensity contour) in the moire map 25 corresponds to a light intensity in a state where the basic units 21a, 22a of the second and first light modulation elements 21, 22 are relatively displaced in a vertical direction with a half pitch. When the moire phenomenon is not generated, a distribution of this moire map must become totally uniform. That is, an intensity distribution of the moire map represents a degree of moire. Here, the intensity distribution is defined by a minimum value/a maximum value of a light intensity.

Figure 9A:
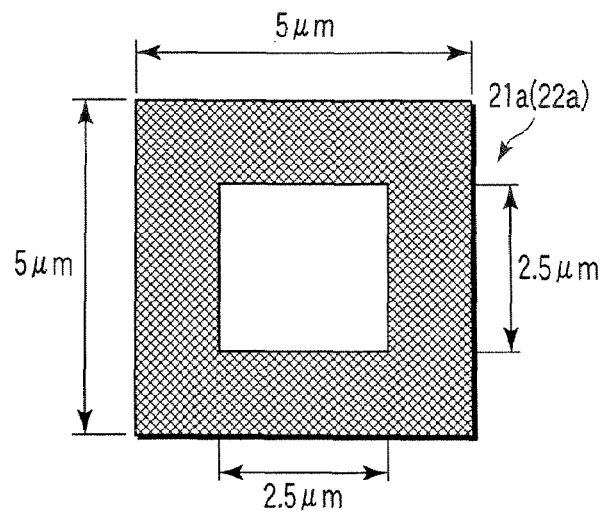
FIGS. 9A and 9B are views schematically showing configurations of basic units of the first and second light modulation elements in a numerical example.

The moire effect was calculated in accordance with the following concrete conditions. In this numerical example, it was assumed that each of the second and the first light modulation elements 21, 22 is of an amplitude modulation type in which each of their basic units 11a and 22a has a square aperture having an aperture ratio of 25%, and each of these light modulation elements is of an amplitude modulation type in which each of their basic units has a square aperture having an aperture ratio of 50%. In case of the amplitude modulation type having the square aperture with the aperture ratio of 25%, as shown in FIG. 9A, the basic unit 21a of the second light modulation element 21 and the basic unit 22a of the first light modulation element 22 are constituted of a light shielding region (hatched region) having a square shape in which one side is equal to a pitch of 5 μm and a light transmitting region (an aperture) which is formed at the center of the light shielding region and has a square shape in which one side is 2.5 μm.

Figure 9B:
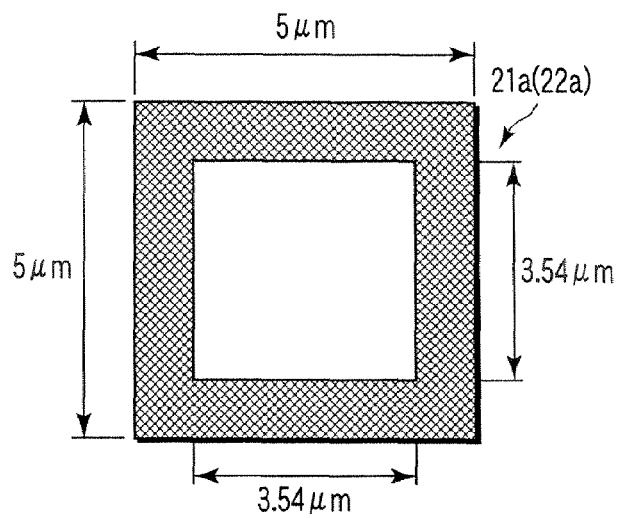

In case of the amplitude modulation type having the square aperture with the aperture ratio of 50%, as shown in FIG. 9B, the basic unit 21a of the second light modulation element 21 and the basic unit 22a of the first light modulation element 22 are constituted of a light shielding region (hatched region) having a square shape in which one side is equal to a pitch of 5 μm and a light transmitting region (an aperture) which is formed at the center of this light shielding region and has a square shape in which one side is approximately 3.54 μm. Furthermore, in this numerical example, it is assumed that an image forming magnification of the image forming optical system 3 is ⅕ and its image side numerical aperture is 0.15. Moreover, it is assumed that the light source 23 is an XeCl excimer laser beam source which supplies a light beam having a wavelength of 308 nm and has a matrix arrangement of 7×7 point light sources 23a, and a coherence factor (a σ value) of illumination of each point light source is 0.52.

Figure 10:
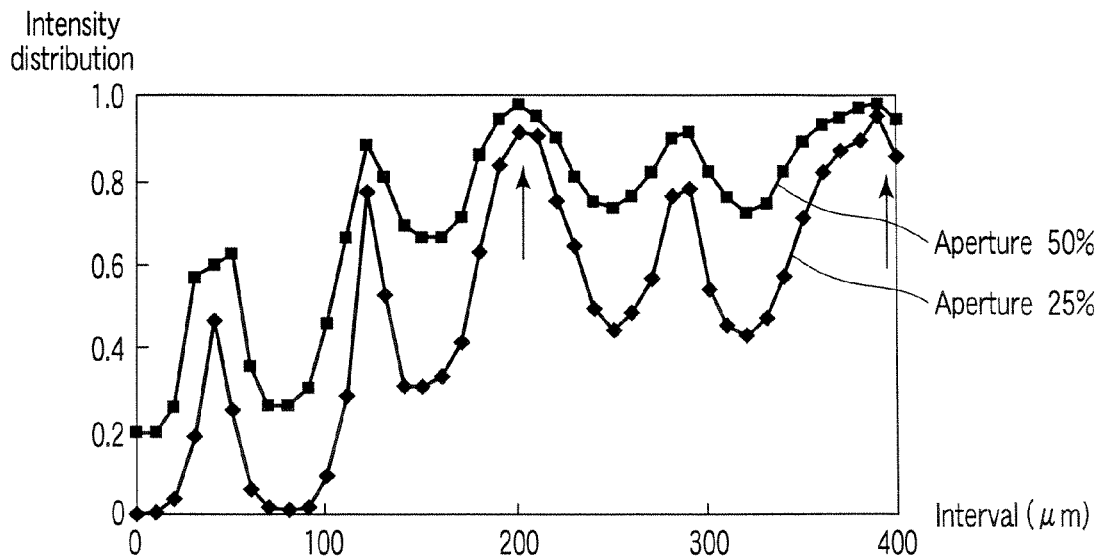
FIG. 10 is a view showing a relationship between an interval (μm) between the first and second light modulation elements and a light intensity distribution of the Moire map in the numerical example.

FIG. 10 is a view showing a relationship between an interval (μm) of the first and second light modulation elements and an intensity distribution of the moire map in this numerical example. Here, the intensity distribution is defined by a minimum value/a maximum value of a light intensity as described above. That is, this distribution represents that a moire effect is smaller (occurrence of a moire phenomenon is suppressed) as a value of a vertical axis is closer to one. Referring to FIG. 10, in a case where both the second light modulation element 21 and the first light modulation element 21 have an aperture ratio of 25% and a case where they have an aperture ratio of 50%, it can be understood that occurrence of the moire phenomenon is substantially eliminated when the interval between the second and first light modulation elements 21, 22 is approximately 200 μm and approximately 400 μm as indicated by an arrow. Additionally, it can be recognized that a small peak appears in the intensity distribution when the interval is approximately 40 μm. Conditions under which occurrence of the moire phenomenon is substantially eliminated (moire is removed) will now be described while casting a spotlight on an "effect by a Fourier image" and a "shift effect by illumination light".

A Effect by Fourier Image

Figure 11:
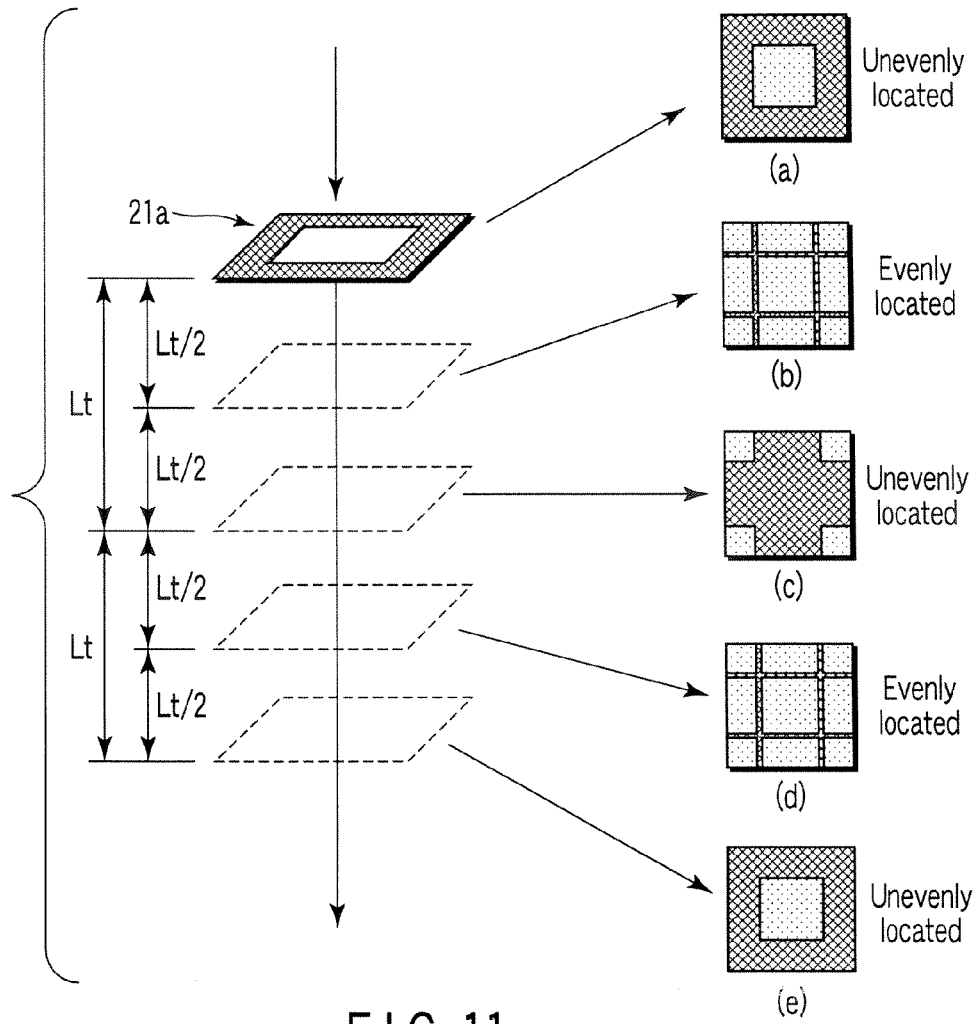
FIG. 11 is a view schematically showing a light intensity generated when one parallel light flux enters one basic unit of the first light modulation element formed of a pattern in which the same basic unit is endlessly repeated.

First, as shown in FIG. 11, a consideration is given on a light distribution which is generated at a position apart from the basic unit 21a by a predetermined distance along a light traveling direction when one parallel light beam enters one basic unit 21a of the second light modulation element 21 having a pattern in which the same basic unit is endlessly repeated as indicated by an arrow. In Fresnel diffraction based on such an endless cycle pattern, a special phenomenon called a "Fourier image" or a "Talbot effect" appears. That is, a distribution which is equal to a complex amplitude of the basic unit 21a as an object appears in accordance with a fixed distance Lt represented by the following Expression (5). In Expression (5), P is a pitch of the basic unit 21a (5 μm in the numerical example) and λ is a wavelength of light (308 nm in the numerical example).

$$Lt = P^2/\lambda \tag{5}$$

Referring to FIG. 11, a light distribution in which an amplitude is eccentrically located to correspond to a pattern obtained by shifting the pattern of the basic unit 21a with a half pitch is generated at a position apart from the basic unit 21a by a distance corresponding to an odd-numbered multiple of the distance Lt, as shown in (c). On the other hand, a light distribution in which an amplitude is eccentrically located to correspond to the pattern of the basic unit 21a is generated at a position apart from the basic unit 21a by an amount which is an even-numbered multiple of the distance Lt as shown in (a) and (e). This is described in detailed in, e.g., "Applied Optics I, pp. 178-179, by Tsuruta, Baifukan Co., Ltd." which is incorporated herein as a reference. Further, a light distribution at an intermediate point of the positions Lt apart from the basic unit 21a has properties that the amplitude is relatively uniformed.

FIG. 12 is a view obtained by adding an effect of a Fourier image in FIG. 10 showing the relationship between the interval of the first and second light modulation elements and the intensity distribution of the moire map. Referring to FIG. 12, from the viewpoint of the effect by a Fourier image, in order to approximate the intensity distribution of the moire map to one to make the amplitude relatively uniform and suppress the moire effect (suppress occurrence of the moire phenomenon), it is desirable for an interval D between the second and first light modulation elements 21, 22 to satisfy the following Conditional Expression (6):

$$D = P^2(2n+1)/2\lambda (n = 0, 1, 2, \ldots) \tag{6}$$

B Shift Effect by Illumination Light

It is assumed that each of the basic unit 21a of the second light modulation element 21 and the basic unit 22a of the first light modulation element 22 shown in FIG. 13A has a square shape in which one side is equal to a pitch P of 5 μm, an equivalent light source 23 having of 7×7 point light sources 23a arranged in a matrix shape (FIG. 13 shows a conformation of 5×5 for simplicity) also has a square shape. In this case, assuming that an incidence angle of a light flux from an outermost side (in a precise sense, a point light source 23c provided at a central point of one side of the square shape) of the equivalent light source 23 having the square shape to the basic unit 21a is θ, a distance, i.e., a shift quantity between a position at which this light flux enters the basic unit 21a and a position at which this light flux enters the basic unit 22a may be represented by tan θ×D (FIG. 13B shows a shift quantity on the basic unit 22a).

Figure 14:
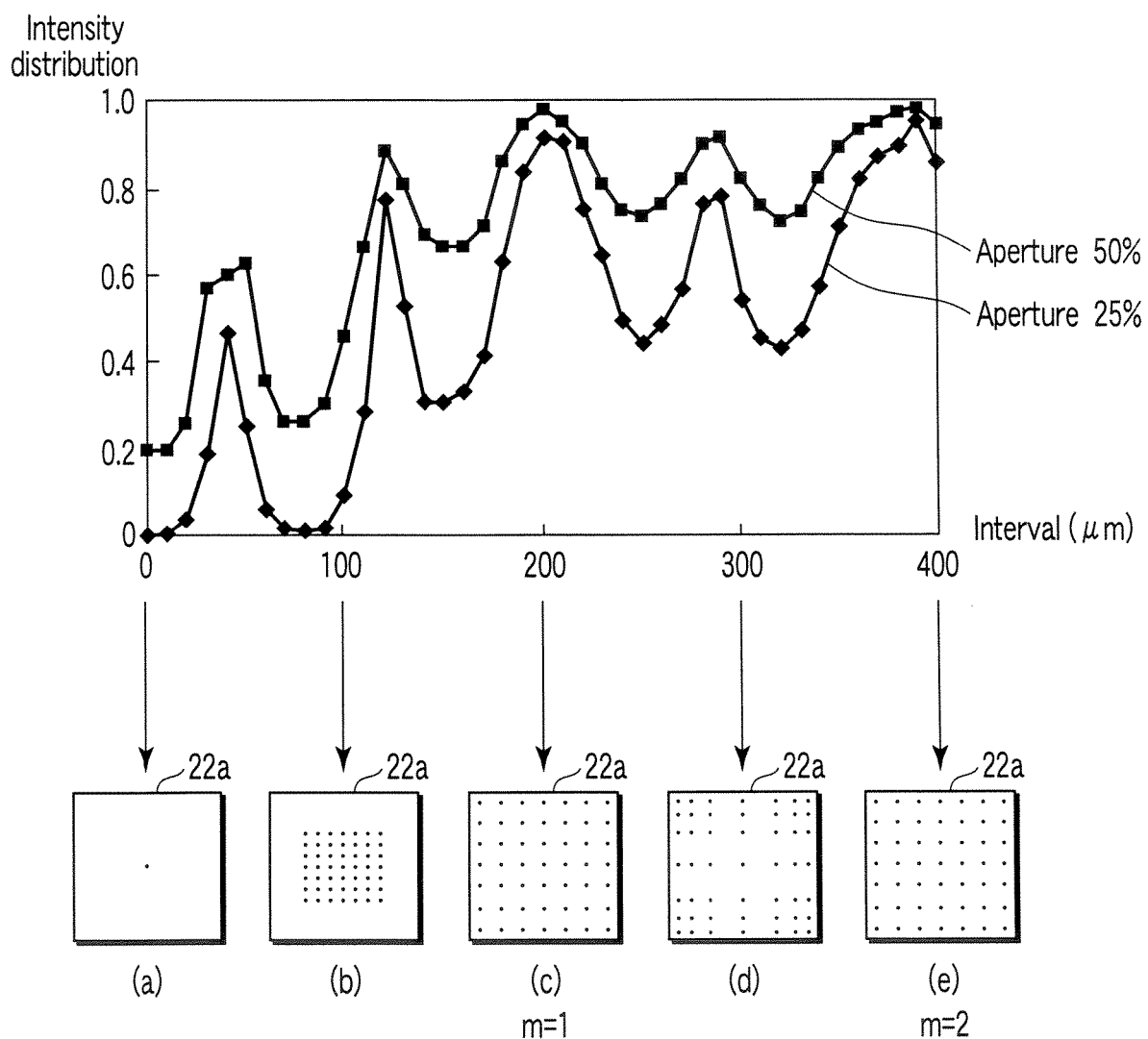
FIG. 14 is a view obtained by adding a shift effect by illumination light flux in FIG. 10 showing the relationship between the interval between the first and second light modulation elements and the light intensity distribution of the Moire map.

FIG. 14 is a view obtained by adding a shift effect by illumination light in FIG. 10 showing the relationship between the interval of the first and second light modulation elements and the intensity distribution of the moire map. Referring to FIG. 14, although a plurality of light flux (flux group) enter a central point on the basic unit 21a of the second light modulation element 21 at various angles, the light fluxes reach one point on the basic unit 22a of the first light modulation element 22 as shown in (a) when the interval D between the second and first light modulation elements 21, 22 is zero. When the interval D increases to 100 μm from zero, the light flux group reaches a plurality of points which are evenly distributed in a small region having a concentric square shape on the basic unit 22a by the shift effect of the illumination light (shown in (b)).

Then, when the interval D increases to 200 μm from 100 μm, the light flux group reaches a plurality of points which are evenly distributed in the entire basic unit 22a (shown in (c)). Furthermore, when the interval D increases to 300 μm from 200 μm, the light flux group reaches a plurality of points which are unevenly distributed in the entire basic unit 22a (shown in (d)). Moreover, when the interval D increases to 400 μm from 300 μm, in other words, when the interval D becomes 400 μm which is two times 200 μm, the light flux group again reaches a plurality of points which are evenly distributed in the entire basic unit 22a (shown in (e)).

When the light flux group reaches a plurality of points which are evenly distributed in the entire basic unit 22a in this manner, i.e., the interval D between the second and first light modulation elements 21, 22 is set to 200 μm or 400 μm, it can be expected that the moire effect becomes minimum. When the interval D is set to 200 μm or 400 μm, the intensity distribution of the moire map is closest to one, which means that the expectation is correct.

That is, from the viewpoint of the shift effect by the illumination light, in order to suppress the moire effect (suppress occurrence of the moire phenomenon), it is desirable for the interval D between the second and first light modulation elements 21, 22 to satisfy the following Conditional Expression (7). As shown in FIG. 14, a state where the interval D is set to 200 μm corresponds to a state where m=1 in Expression (7), and a state where the interval D is set to 400 μm corresponds to a state where m=2 in Expression (7).

$$\tan\theta \times D = m \times P/2 (m=1, 2, 3, \ldots) \quad (7)$$

When both Conditional Expression (6) derived from the viewpoint of the effect by the Fourier image and Conditional Expression (7) derived from the viewpoint of the shift effect by the illumination light beam are simultaneously satisfied, it can be considered that the moire effect can be suppressed to the minimum level. That is, it is desirable to satisfy the following Conditional Expression (8) in order to suppress the moire effect to the minimum level (suppress occurrence of the moire phenomenon to the minimum level):

$$P \approx m \times \lambda / \{(2n+1)\tan\theta\} \quad (8)$$

In the above-described numerical example, the image forming magnification of the image forming optical system 3 is ⅕ and its image side numerical aperture is 0.15. Thus, an object side numerical aperture of the image forming optical system 3 is 0.15/5. Moreover, since the coherence factor (the σ value) of illumination is 0.52, a numerical aperture of an illumination light beam is 0.52×0.15/5. As described above, θ is an incidence angle of a light flux from the central point of one side of the outer shape of the square equivalent light source 23 to the basic unit 21a, it can be obtained from the following Expression (9):

$$\tan\theta = 0.52 \times 0.15/5/\sqrt{2} = 0.011 \quad (9)$$

On the other hand, since the wavelength λ of light is 308 nm, assuming that n=2 and m=1, a pitch satisfying Conditional Expression (8) is P=5.6 μm. This is substantially equal to the pitch P=5 μm used in the numerical example, and it can be understood that Conditional Expression (8) is substantially satisfied in the numerical example.

Based on the above-described knowledge, in this embodiment shown in FIG. 4, in order to substantially uniform both an amplitude and a phase of a light distribution generated on the modulation surface of the light modulation element 1 as the first light modulation element by using the visualization mask 11 as the second light modulation element, the interval between the light modulation element 1 and the visualization mask 11 is set to substantially satisfy Conditional Expression (6) or (7). As a result, a V-shaped light intensity distribution formed on the surface (a predetermined flat surface) of the processing target substrate 4 by the function of the light modulation element 1 can be rapidly and accurately measured based on a single application of a light beam and an evaluation of a change in physical properties without being substantially affected by the moire phenomenon due to relative displacement or the like of the light modulation element 1 and the visualization mask 11 in the plane direction.

Although the light modulation element 1 has the pattern formed by repeating the basic unit in the above description, it may have any other pattern, e.g., a simple phase step such as one described in a previous application incorporated herein as a reference. In such a case, however, the light modulation element 1 must be arranged on the image forming optical system side.

An effect of this embodiment will now be verified based on a concrete embodiment. In the embodiment and comparative examples, a KrF excimer laser beam source which supplies a light beam having a wavelength of 248 nm is used as the light source 2a, an image forming optical system having an image forming magnification of ⅕ and an image side numerical aperture of 0.13 is used as the image forming optical system 3, and a sample substrate obtained by forming an amorphous silicon film having a thickness of 50 nm on a base substrate, e.g., a glass substrate is used as the sample substrate 12. Additionally, a coherence factor (a σ value) of illumination is 0.5.

Figure 15A:
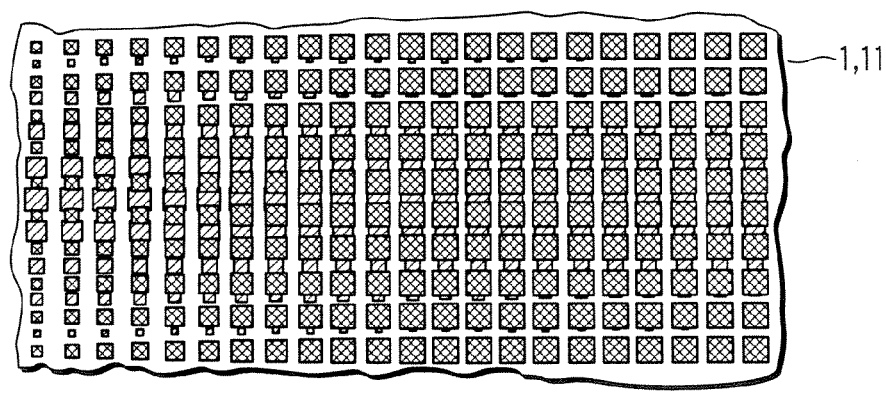
FIG. 15A is a view showing an assembly or a unit in which phase modulating portions of a light modulation element are positioned between light shielding portions of a visualization mask so that the light modulation element is appressed against the visualization mask as a first comparative example.

In a first comparative example, as shown in FIG. 15A, a phase modulating portion of a light modulation element 1 is placed between respective light shielding portions of a visualization mask 11 so that the light modulation element 1 is appressed against the visualization mask 11. At this time, a light intensity distribution obtained on a sample substrate 12 in the first comparative example is represented in contour in FIG. 15B. In a second comparative example, as shown in FIG. 16A, each light shielding portion of a visualization mask 11 is superimposed on each phase modulating portion of a light modulation element 1 so that the light modulation element 1 is appressed against the visualization mask 11. At this time, in the second comparative example, a light intensity distribution obtained on a sample substrate 12 is represented in contour in FIG. 16B.

Figure 15B:
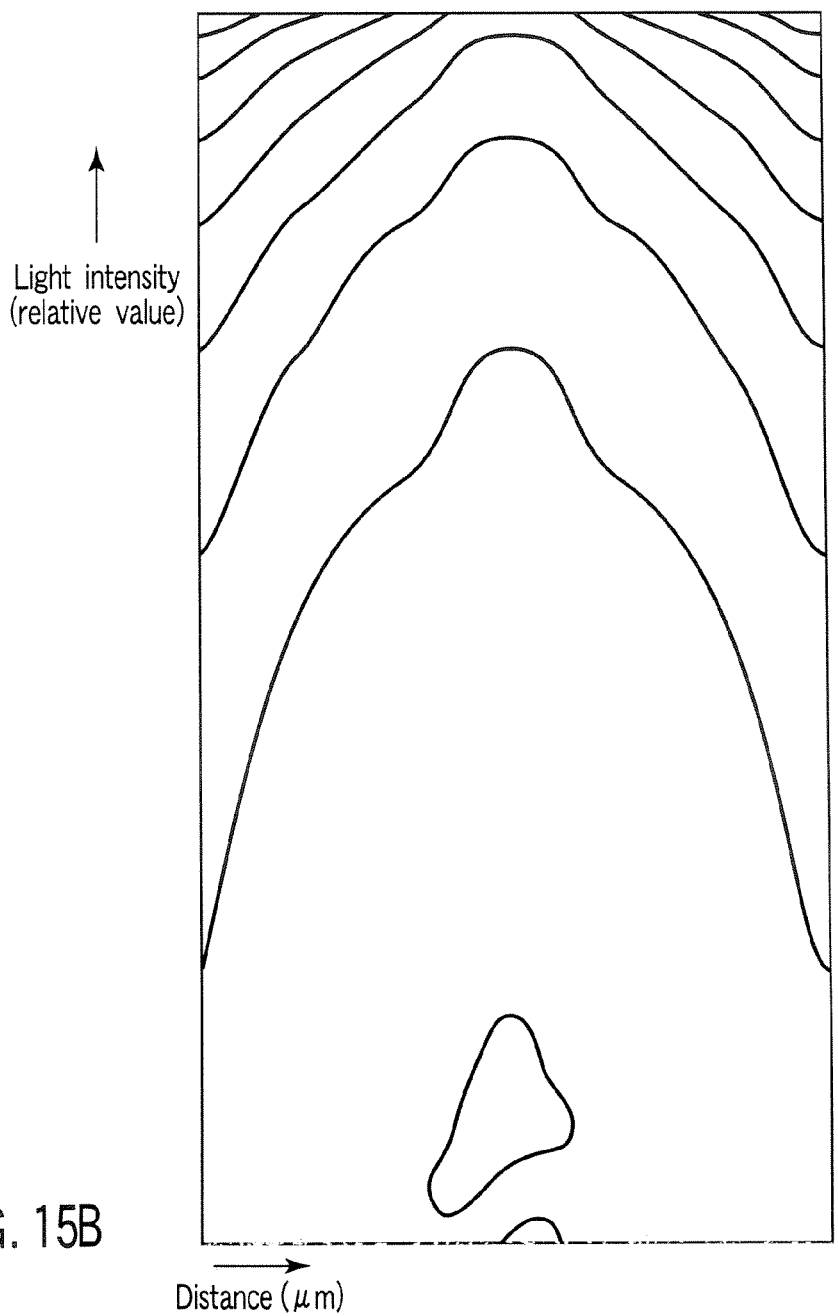
FIG. 15B is a view showing in contour a light intensity distribution obtained on a sample substrate by using this assembly.
Figure 16A:
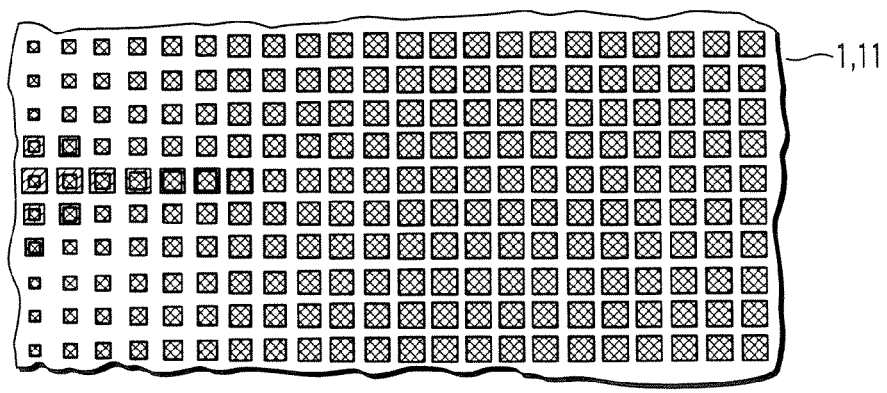
FIG. 16A is a view showing an assembly in which light shielding portions of a visualization mask are superimposed on phase modulating portions of a light modulation element so that the light modulation element is appressed against the visualization mask as a second comparative example.
Figure 16B:
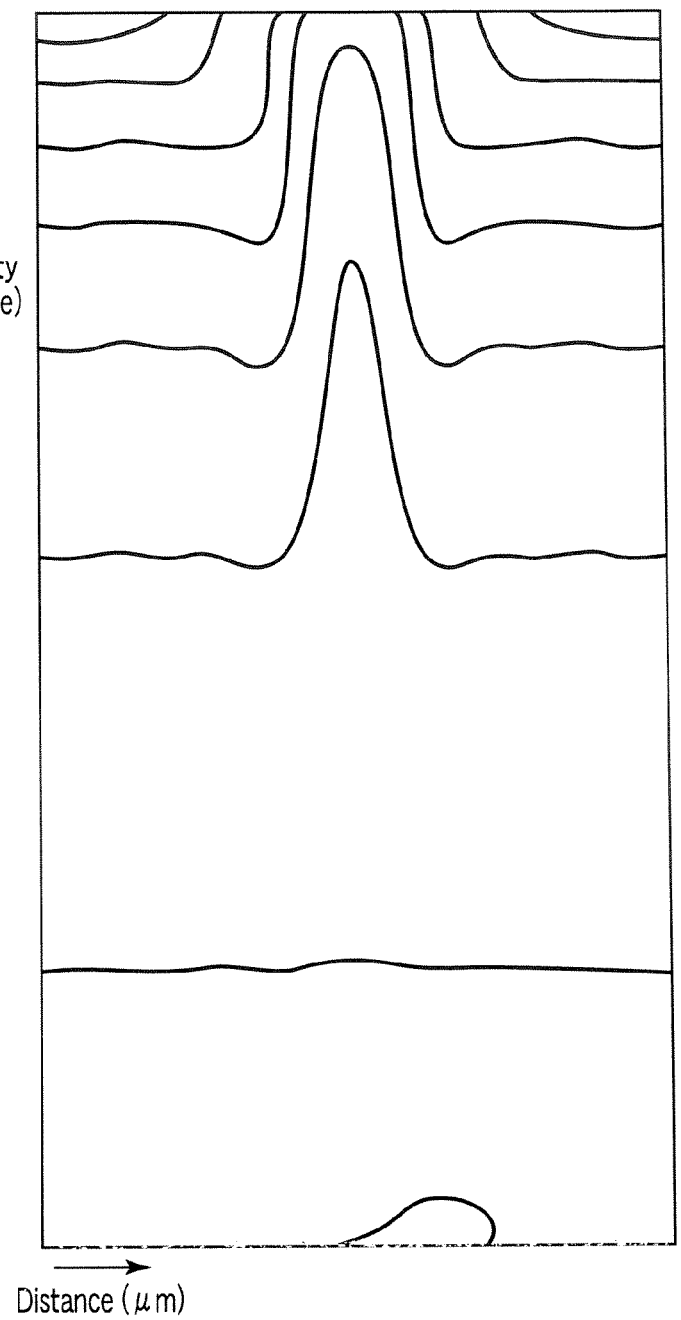
FIG. 16B is a view showing in contour a light intensity distribution obtained on a sample substrate by using this assembly.

Referring to FIGS. 15B and 16B, it can be understood that the light intensity distributions formed on the respective sample substrates 12 are greatly different from each other in the first comparative example and the second comparative example. Further, in each comparative example, it can be recognized that the contour line of the light intensity distribution obtained on the sample substrate 12 does not match the V-shaped light intensity distribution (see FIG. 3B) formed on the surface of the processing target substrate 4 by the light modulation element 1 alone.

On the other hand, in this embodiment, the interval D between the light modulation element 1 and the visualization mask 11 is set to 260 μm in order to substantially satisfy both Conditional Expression (6) derived from the viewpoint of the effect by the Fourier image and Conditional Expression (7) derived from the viewpoint of the shift effect by the illumination light. A light intensity distribution obtained on the sample substrate 12 in this embodiment is represented in contour in FIG. 17. Referring to FIG. 17, it can be understood that the contour line of the light intensity distribution obtained on the sample substrate 12 in the embodiment substantially matches with the V-shaped light intensity distribution (see FIG. 3B) formed on the surface of the processing target substrate 4 by the light modulation element 1 alone.

In the embodiment, an a-Si layer (an amorphous Si layer) of the sample substrate 12 arranged on the image forming surface of the image forming optical system 3 is irradiated with a light beam in accordance with the above-described conditions. Observing a boundary between a p-Si region which has changed into poly-Si and an a-Si region which has remained as amorphous Si by using an optical microscope, it was confirmed that the contour line of the light intensity distribution shown in FIG. 17 substantially matches with the V-shaped light intensity distribution formed on the surface of the processing target substrate 4 by the light modulation element 1 alone. Furthermore, it was also confirmed that the light intensity distribution in FIG. 17 is not dependent on a relative positional relationship of the two light modulation elements 1 and 11. That is, the moire phenomenon was not generated in the embodiment.

In the above description, the present invention is applied to measurement of a light intensity distribution in the crystallization apparatus which irradiates a non-single-crystal semiconductor film with a light beam having a predetermined light intensity distribution to generate a crystallized semiconductor film. However, the present invention is not restricted thereto, and it is possible to apply the present invention to measurement of a light intensity distribution in a generation apparatus and a generation method of a light intensity distribution which generate a light intensity distribution on a predetermined surface, or apply the present invention to a generation apparatus and a generation method of a light intensity distribution which generate a light intensity distribution on a predetermined surface through a pair of light modulation elements.

Specifically, in a crystallization apparatus, a pair of light modulation elements which form light intensity distributions which one-dimensionally change along directions orthogonal to each other may be used to generate on a processing target substrate a light intensity distribution which two-dimensionally changes. In this case, even if processing of one light modulation element which forms a light intensity distribution which two-dimensionally changes is difficult, it is easy to respectively process the pair of light modulation elements which form light intensity distributions which one-dimensionally change. Furthermore, when a plurality of (more than two) light modulation elements are prepared in advance and two light modulation elements are combined from these elements, two-dimensional light intensity distributions having various patterns can be generated in accordance with combinations.

Moreover, although the foregoing embodiment has described the case where the sample substrate 12 is provided in the crystallization optical path in place of the processing target substrate 4 to confirm or measure a light intensity distribution in case of confirming or measuring a light intensity distribution of the light modulation element 1, the visualization mask 11 may be provided in the crystallization optical path and a predetermined test position of the processing target substrate 4 may be irradiated with a crystallization laser beam or a test laser beam to confirm or measure a light intensity distribution of the laser beam at any desired timing, e.g., before starting a crystallization step, during the crystallization step or after the crystallization step. As to confirmation or measurement of a light intensity distribution of a laser beam in this embodiment, since the upper layer insulating film (a cap film) formed on a surface of an amorphous silicon film is transparent, confirmation or measurement can be performed through this film.

Figure 18A:
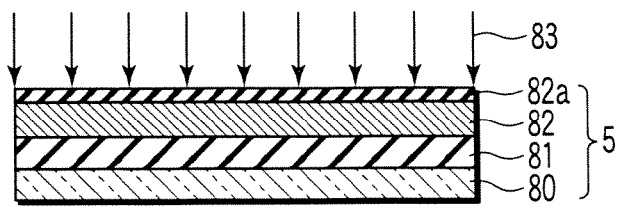
FIGS. 18A to 18E are process cross-sectional views showing steps of manufacturing an electronic device by using a crystallization apparatus which carries out the generation method of a light intensity distribution according to this embodiment.

A description will now be given as to a method of manufacturing an electronic device in a region crystallized by using the crystallization apparatus according to this embodiment with reference to FIGS. 18A to 18E. As shown in FIG. 18A, there is prepared a processing target substrate 5 obtained by forming an underlying film 81 (e.g., a laminated film consisting of SiN having a film thickness of 50 nm and $SiO_2$ having a film thickness of 100 nm), an amorphous semiconductor film 82 (e.g., a film formed of Si, Ge, SiGe or the like having a film thickness of approximately 50 nm to 200 nm) and a cap film 82a (e.g., an $SiO_2$ film having a film thickness of 30 nm to 300 mm) on an insulating substrate 80 (formed of, e.g., alkali glass, quartz glass, plastic, polyimide or the like) by a chemical vapor deposition method or a sputtering method. Then, the crystallization apparatus according to this embodiment is used to irradiate a predetermined region on an upper surface of the amorphous semiconductor film 82 with a laser beam 83 (e.g., a KrF excimer laser beam or an XeCl excimer laser beam) as shown by arrows.

Figure 18B:
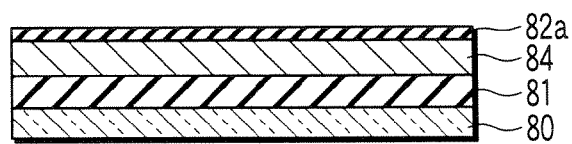
Figure 18C:
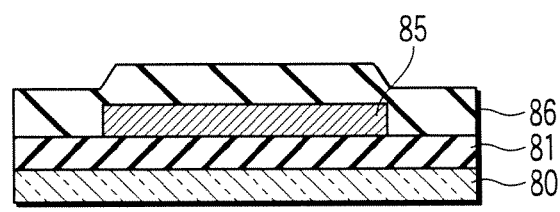
Figure 18D:
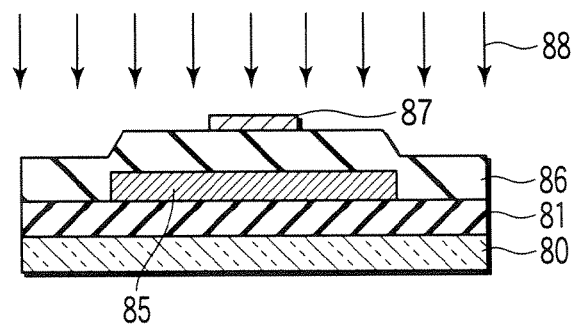
Figure 18E:
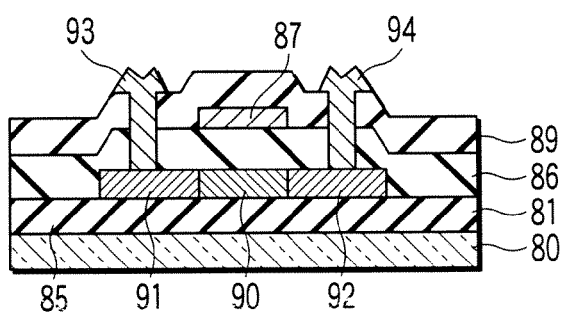
Figure 19A:
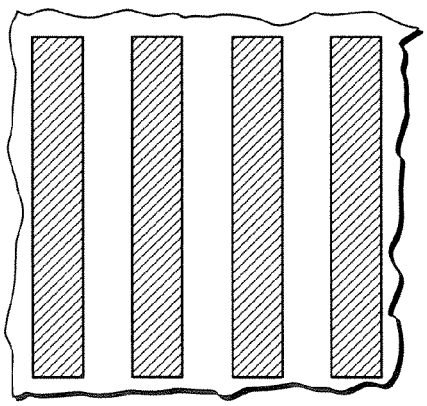
FIGS. 19A and 19B are views showing light modulation elements having different one-dimensional patterns.
Figure 19B:
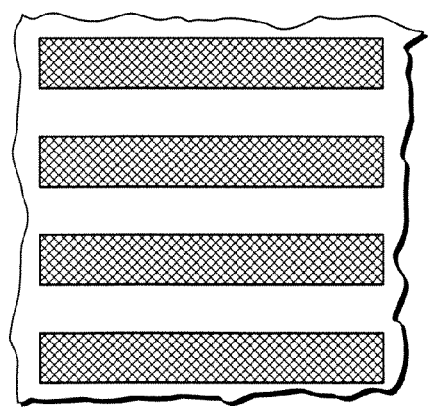
Figure 19C:
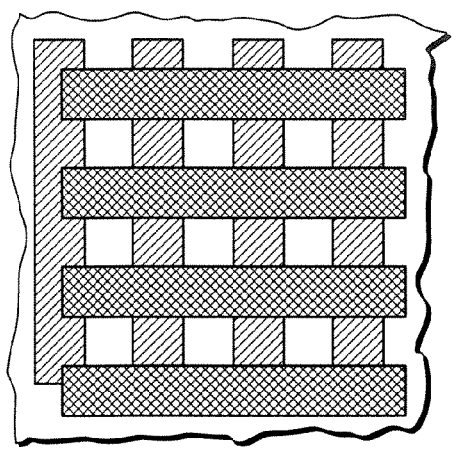
FIG. 19C is a view showing a pattern obtained by superimposing these patterns.
Figure 20A:
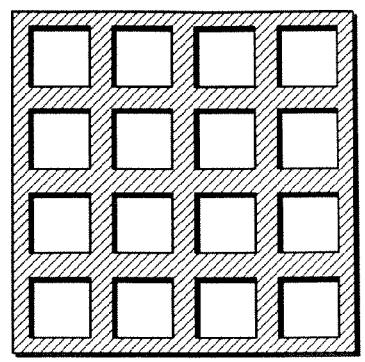
FIGS. 20A and 20B are views showing light modulation elements having different two-dimensional patterns.
Figure 20B:
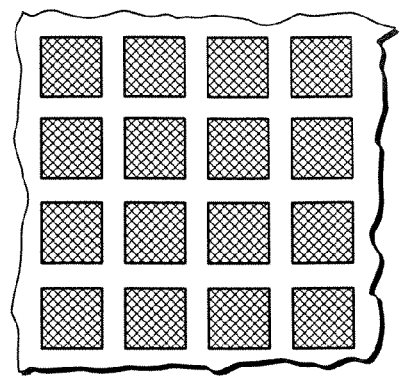
Figure 20C:
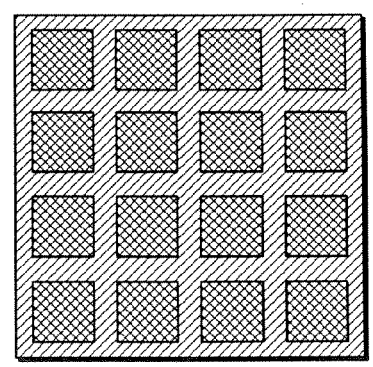
FIGS. 20C and 20D are views showing patterns obtained by superimposing these patterns in different states.
Figure 20D:
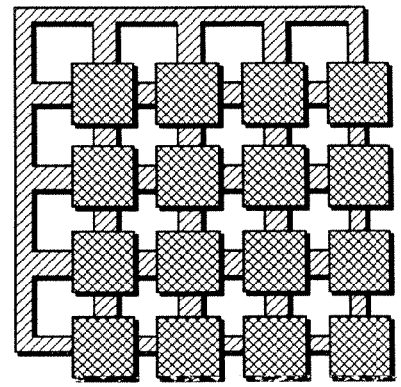

In this manner, as shown in FIG. 18B, a polycrystal or single-crystallized semiconductor film 84 having a crystal with a large particle size is generated in the amorphous semiconductor film 82. Then, after the cap film 82a is removed by etching, as shown in FIG. 18C, the polycrystal or single-crystallized semiconductor film 84 is processed into an island-shaped semiconductor film 85 which serves as a region in which, e.g., a film transistor is formed by using a photolithography technique, and an $SiO_2$ film having a film thickness of 20 nm to 100 nm is formed as a gate insulating film 86 on upper surfaces of the semiconductor film 85 and the underlying film 81 by using the chemical vapor deposition method or the sputtering method. Furthermore, as shown in FIG. 18D, a gate electrode 87 (e.g., silicide or MoW) is formed on a part of the gate insulating film 86, and impurity ions 88 (phosphor in case of an N channel transistor, and boron in case of a P channel transistor) are implanted into the semiconductor film 85 with the gate electrode 87 used as a mask. Thereafter, annealing processing is carried out in a nitrogen atmosphere (e.g., for one hour at 450° C.) to activate the impurities so that a source region 91 and a drain region 92 are formed on both sides of a channel region 90 in the island-shaped semiconductor film 85. Then, as shown in FIG. 18E, an interlayer insulating film 89 which covers the entire product is formed, each contact hole is formed in this interlayer insulating film 89 and the gate insulating film 86, and a source electrode 93 and a drain electrode 94 which are respectively connected with the source region 91 and the drain region 92 are formed.

The gate electrode 87 may be formed in accordance with a position of a crystal with a large particle size (one or more crystal grains) of the polycrystal semiconductor film or single-crystallized semiconductor film 84 generated at the steps shown in FIGS. 18A and 18B in the above-described steps. Thus, a channel 90 is formed below the gate electrode 87. According to the above-described steps, it is possible to form a polycrystal transistor or a thin film transistor in the single-crystallized semiconductor. The thus manufactured polycrystal transistor or single-crystallized transistor is applicable to a drive circuit for a liquid crystal display device (display) or an electroluminescent (EL) display or an integrated circuit for a memory (an SRAM or a DRAM) or a CPU.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A generation method of a light intensity distribution, comprising:

passing a light beam through a first light modulation element and a second light modulation element which are arranged to be apart from each other by a distance D and face each other in parallel to optically modulate the light beam that enters the light modulation elements, thereby generating a light intensity distribution on a focusing plane of an image forming optical system located on an optical axis of the second light modulation element, the focusing plane being positioned on a surface to be treated at a substrate, wherein the first light modulation element has a pattern formed by repeating a basic unit having a pitch P, and wherein the distance D satisfies the following condition:

$D \approx P^2(2+n1)/2\lambda$ where λ is a wavelength of the light beam, and n is an integer equal to or above 0 (0, 1, 2, 3...).

2. The generation method of a light intensity distribution according to claim 1, wherein the light beam from the first light modulation element and the second light modulation element is image-formed on the target surface through an image forming optical system.

3. The generation method of a light intensity distribution according to claim 1, the second light modulation element has a pattern formed by repeating a basic unit having a predetermined pitch.

4. A generation method of a light intensity distribution, comprising:

passing a light beam through a first light modulation element and a second light modulation element which are arranged to be apart from each other by a distance D and face each other in parallel to optically modulate the light beam that enters the light modulation elements, thereby generating a light intensity distribution on a focusing plane of an image forming optical system located on an optical axis of the second light modulation element, the focusing plane being positioned on a surface to be treated at a substrate, wherein the first light modulation element has a pattern formed by repeating a basic unit having a pitch P, and wherein the distance D satisfies the following conditions:

$$\tan\theta \times D \approx m \times P/2$$

where θ is a maximum value of an incidence angle of the light beam along a pitch direction with respect to the first light modulation element, and m is an integer equal to or above 1 (1, 2, 3, . . . ).

5. A generation method of a light intensity distribution comprising:

passing a light beam through a first light modulation element and a second light modulation element which are arranged to be apart from each other by a distance D and face each other in parallel to optically modulate the light beam that enters the light modulation elements, thereby generating a light intensity distribution on a focusing plane of an image forming optical system located on an optical axis of the second light modulation element, the focusing plane being positioned on a surface to be treated at a substrate, wherein the first light modulation element has a pattern formed by repeating a basic unit having a pitch P, wherein the distance D satisfies the following condition:

$$D \approx P^2(2n+1)/2\lambda$$

where λ is a wavelength of the light beam, and n is an integer equal to or above 0 (0, 1, 2, 3. . . ), wherein the light beam from the first light modulation element and the second light modulation element is image-formed on the target surface through an image forming optical system, and wherein the pitch P of the basic unit of the first light modulation element is smaller than a point spread range of the image forming optical system.

6. A generation method of a light intensity distribution comprising:

passing a light beam through a first light modulation element and a second light modulation element which are arranged to be apart from each other by a distance D and face wherein the first light modulation element has a pattern formed by repeating a basic unit having a pitch P, wherein the distance D satisfies the following condition:

$$D \approx P^2(2n+1)/2\lambda$$

where λ is a wavelength of the light beam, and n is an integer equal to or above 0 (0, 1, 2, 3. . . ), and wherein the instensity as a combined light intensity distriution of a first light intensity distribution which is formed on the target surface by the first light modulation element and one-dimensionally varies along directions orthogonal to each other and a second light intensity distribution formed on the target surface by the second light intensity distribution is formed on a physical property changing member of which one surface is set to the target surface and whose physical properties change in accordance with an intensity of an incident light beam, and the first light intensity distribution or the second light intensity distribution is measured based on two-dimensional information of a change in physical properties of the physical property changing member.

7. A generation method of a light intensity distribution, comprising:

passing a light beam through a first light modulation element and a second light modulation element which are arranged to be apart from each other by a distance D and face each other in parallel to optically modulate the light beam that enters the light modulation elements, thereby generating a light intensity distribution on a focusing plane of an image forming optical system located on an optical axis of the second light modulation element, the focusing plane being positioned on a surface to be treated at a substrate, wherein the first light modulation element has a pattern formed by repeating a basic unit having a pitch P, wherein the distance D satisfies the following condition:

$$D \approx P^2(2n+1)/2\lambda$$

where λ is a wavelength of the light beam, and n is an integer equal to or above 0 (0, 1, 2, 3 . . . ), and wherein the light intensity distribution as a combined light intensity distribution of a first light intensity distribution which is formed on the target surface by the first light modulation element and one-dimensionally varies along directions orthogonal to each other and a second light intensity distribution formed on the target surface by the second light intensity distribution is formed on a physical property changing member of which one surface is set to the target surface and whose physical properties change in accordance with an intensity of an incident light beam, and the first light intensity distribution or the second light intensity distribution is measured based on two-dimensional information of a change in physical properties of the physical property changing member.

8. The generation method of a light intensity distribution according to claim 7, wherein the physical property changing member has an amorphous silicon film which is physically changed into a polycrystal silicon film by incidence of the light intensity distribution.

9. The generation method of a light intensity distribution according to claim 8, wherein a boundary between a region which has physically changed from the amorphous silicon ilm into the polycrystal silicon film and a region which has remained as the amorphous silicon film in the physical property changing member is imaged, and the first light intensity distribution or the second light intensity distribution is measured based on information of the imaged boundary.

10. A generation method of a light intensity distribution, comprising:

passing a light beam through a first light modulation element and a second light modulation element which are arranged to be apart from each other by a distance D and face each other in parallel to optically modulate the light beam that enters the light modulation elements, thereby generating a light intensity distribution on a focusing plane of an image forming optical system located on an optical axis of the second light modulation element, the focusing plane being positioned on a surface to be treated at a substrate, wherein the first light modulation element has a pattern formed by repeating a basic unit having a pitch P, wherein the distance D satisfies the following condition:

$D \approx P^2(2n+1)/2\lambda$ where $\lambda$ is a wavelength of the light beam, and n is an integer equal to or above 0 (0, 1, 2, 3 . . . ), and wherein a non-single-crystal semiconductor film arranged on the predetermined surface is irradiated with the light intensity distribution as a combined light intensity distribution of a first light intensity distribution generated by the first light modulation element and a second light intensity distribution generated by the second light modulation element, thereby crystallizing the non-single-crystal semiconductor film.

* * * * *